(12) United States Patent
Lee et al.

(10) Patent No.: US 11,978,673 B2
(45) Date of Patent: May 7, 2024

(54) METHOD OF FABRICATING SEMICONDUCTOR DEVICE

(71) Applicant: SAMSUNG ELECTRONICS CO., LTD., Suwon-si (KR)

(72) Inventors: Kyoungwoo Lee, Hwaseong-si (KR); Minkwon Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 346 days.

(21) Appl. No.: 17/537,571

(22) Filed: Nov. 30, 2021

(65) Prior Publication Data
US 2022/0319907 A1    Oct. 6, 2022

(30) Foreign Application Priority Data

Apr. 6, 2021 (KR) .......................... 10-2021-0044789

(51) Int. Cl.
*H01L 21/8234* (2006.01)
*H01L 21/033* (2006.01)
(Continued)

(52) U.S. Cl.
CPC .. *H01L 21/823475* (2013.01); *H01L 21/0332* (2013.01); *H01L 21/308* (2013.01); *H01L 21/31144* (2013.01); *H01L 21/76224* (2013.01); *H01L 21/76877* (2013.01); *H01L 21/823871* (2013.01); *H01L 29/66477* (2013.01)

(58) Field of Classification Search
CPC ............. H01L 21/0228; H01L 21/0332; H01L 21/0337; H01L 21/308; H01L 21/31116; H01L 21/31144; H01L 21/76224; H01L 21/76816; H01L 21/76877; H01L 21/76895; H01L 21/823431; H01L 21/823475; H01L 21/823871; H01L 23/485; H01L 23/5283; H01L 23/5286; H01L 29/0673; H01L 29/165; H01L 29/42392; H01L 29/66439; H01L 29/775; H01L 29/7848; H01L 29/78696; B82Y 10/00

See application file for complete search history.

(56) References Cited

U.S. PATENT DOCUMENTS 7,902,074 B2    3/2011    Niroomand et al.
9,099,400 B2    8/2015    Huang et al.
(Continued)

FOREIGN PATENT DOCUMENTS

KR    10-2018-0064273 A    6/2018

*Primary Examiner* — Cheung Lee
(74) *Attorney, Agent, or Firm* — Muir Patent Law, PLLC

(57) ABSTRACT

Disclosed is a semiconductor device fabrication method including forming an interlayer dielectric layer and a lower mask layer on a substrate, forming on the lower mask layer first and second upper mask patterns spaced apart from each other in a first direction, wherein each of the first and second upper mask patterns has a line part extending in a second direction and a first protruding part protruding from the line part, forming a spacer covering sidewalls of the line parts of the first and second upper mask patterns and a filling pattern filling a space between the first protruding parts of the first and second upper mask patterns, etching the lower mask layer to form lower mask patterns, etching the interlayer dielectric layer to form grooves on the interlayer dielectric layer, and forming wiring lines in the grooves.

20 Claims, 24 Drawing Sheets

(51) Int. Cl.
*H01L 21/308* (2006.01)
*H01L 21/311* (2006.01)
*H01L 21/762* (2006.01)
*H01L 21/768* (2006.01)
*H01L 21/8238* (2006.01)
*H01L 29/66* (2006.01)

(56) References Cited

U.S. PATENT DOCUMENTS

| | | |
|---|---|---|
| 9,536,778 B2 | 1/2017 | Yuan et al. |
| 9,941,164 B1 | 4/2018 | Kim |
| 10,553,431 B2 | 2/2020 | Huang et al. |
| 10,593,549 B2 | 3/2020 | Lazzarino |
| 10,636,667 B2 | 4/2020 | Lin et al. |
| 10,692,728 B2 | 6/2020 | Zhou et al. |
| 10,770,295 B2 | 9/2020 | Lazzarino et al. |

METHOD OF FABRICATING SEMICONDUCTOR DEVICE

CROSS-REFERENCE TO RELATED APPLICATION

This U.S. nonprovisional application claims priority under 35 U.S.C. § 119 to Korean Patent Application No. 10-2021-0044789 filed on Apr. 6, 2021, in the Korean Intellectual Property Office, the disclosure of which is hereby incorporated by reference in its entirety.

BACKGROUND

1. Field

Embodiments relate to a method of fabricating a semiconductor device, and more particularly, to a method of fabricating a semiconductor device including a field effect transistor.

2. Description of the Related Art

A semiconductor device may include an integrated circuit with metal oxide semiconductor field effect transistors (MOSFETs). As sizes and design rules of the semiconductor device are gradually decreased, sizes of the MOSFETs are also increasingly scaled down. The scale down of MOSFETs may deteriorate operating characteristics of the semiconductor device. Accordingly, methods of fabricating semiconductor devices having superior performance while overcoming issues associated with high integration of the semiconductor devices have been researched.

SUMMARY

According to embodiments, a method of fabricating a semiconductor device may include sequentially forming an interlayer dielectric layer and a lower mask layer on a substrate, forming on the lower mask layer a first upper mask pattern and a second upper mask pattern that are spaced apart from each other in a first direction, each of the first and second upper mask patterns having a line part that extends in a second direction intersecting the first direction and a first protruding part that protrudes from the line part, the first protruding parts of the first and second upper mask patterns being adjacent to each other, forming a spacer and a filling pattern, the spacer covering sidewalls of the line parts of the first and second upper mask patterns, and the filling pattern filling a space between the first protruding parts of the first and second upper mask patterns, using the first upper mask pattern, the second upper mask pattern, the spacer, and the filling pattern as an etching mask to etch the lower mask layer to form a plurality of lower mask patterns, using the lower mask patterns as an etching mask to etch the interlayer dielectric layer to form a plurality of grooves on the interlayer dielectric layer, and forming a plurality of wiring lines in the grooves.

According to embodiments, a method of fabricating a semiconductor device may include sequentially forming an interlayer dielectric layer and a lower mask layer on a substrate, forming on the lower mask layer a first upper mask pattern and a second upper mask pattern that are spaced apart from each other in a first direction, each of the first and second upper mask patterns having a line part that extends in a second direction intersecting the first direction and a protruding part that protrudes from the line part, the protruding parts of the first and second upper mask patterns being adjacent to each other, forming a spacer layer that covers the lower mask layer, the first upper mask pattern, and the second upper mask pattern, allowing the spacer layer to undergo an etch-back process to form a spacer and a filling pattern, using the first upper mask pattern, the second upper mask pattern, the spacer, and the filling pattern as an etching mask to etch the lower mask layer to form a plurality of lower mask patterns, using the lower mask patterns as an etching mask to etch the interlayer dielectric layer to form a plurality of grooves on the interlayer dielectric layer, and forming a plurality of wiring lines in the grooves. A first space may be between the protruding parts of the first and second upper mask patterns. A second space may be between the line parts of the first and second upper mask patterns. The first space may maintain a constant width and extend in the second direction. The spacer layer may completely fill the first space and partially fill the second space.

According to embodiments, a method of fabricating a semiconductor device may include sequentially forming an interlayer dielectric layer and a lower mask layer on a substrate, forming an upper mask layer on the lower mask layer, forming a plurality of photoresist patterns on the upper mask layer, using the photoresist patterns as an etching mask to etch the upper mask layer to form a first upper mask pattern and a second upper mask pattern that are spaced apart from each other in a first direction, each of the first and second upper mask patterns having a line part that extends in a second direction intersecting the first direction and a first protruding part that protrudes from the line part, the first protruding parts of the first and second upper mask patterns being adjacent to each other, forming a spacer layer that covers the lower mask layer, the first upper mask pattern, and the second upper mask pattern, allowing the spacer layer to undergo an etch-back process to form a spacer and a filling pattern, the spacer covering sidewalls of the line parts of the first and second upper mask patterns, and the filling pattern filling a space between the first protruding parts of the first and second upper mask patterns, using the first upper mask pattern, the second upper mask pattern, the spacer, and the filling pattern as an etching mask to etch the lower mask layer to form a plurality of lower mask patterns, using the lower mask patterns as an etching mask to etch the interlayer dielectric layer to form a plurality of grooves on the interlayer dielectric layer, and forming a plurality of wiring lines in the grooves.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
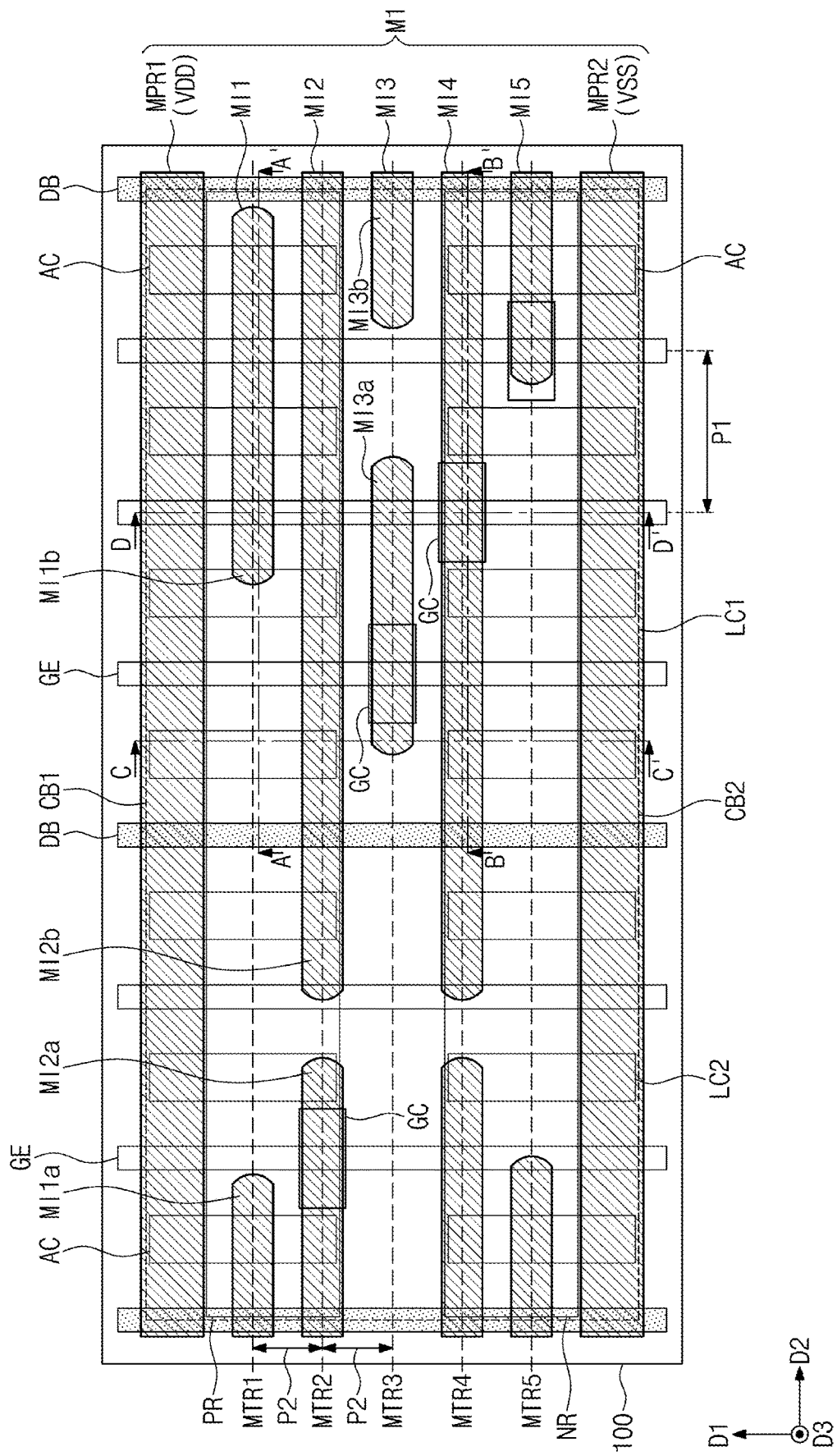
FIG. 1 illustrates a plan view of a semiconductor device according to embodiments.
Figure 2A:
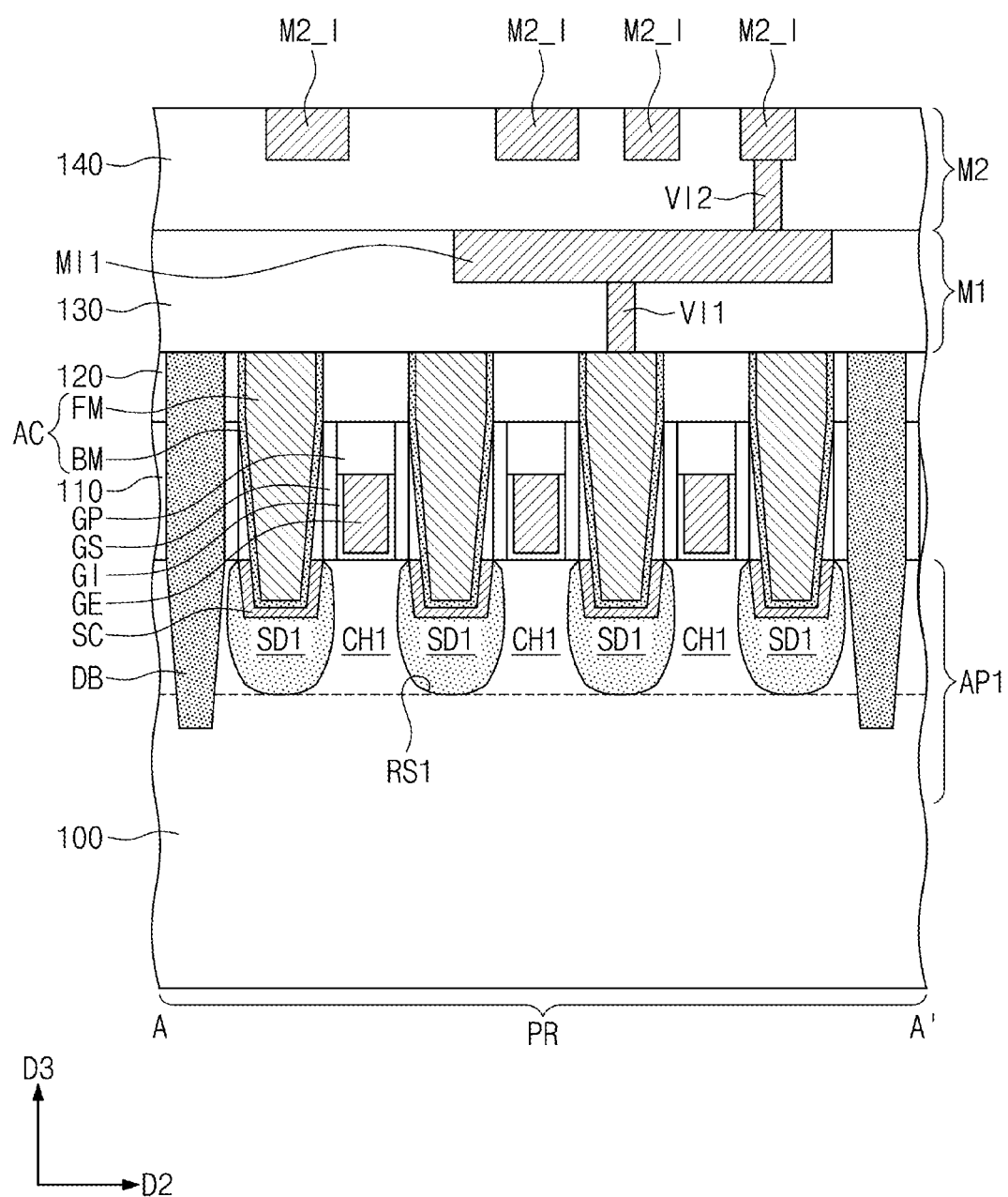
FIGS. 2A, 2B, 2C, and 2D illustrate cross-sectional views respectively taken along lines A-A', B-B', C-C', and D-D' of FIG. 1.
Figure 2B:
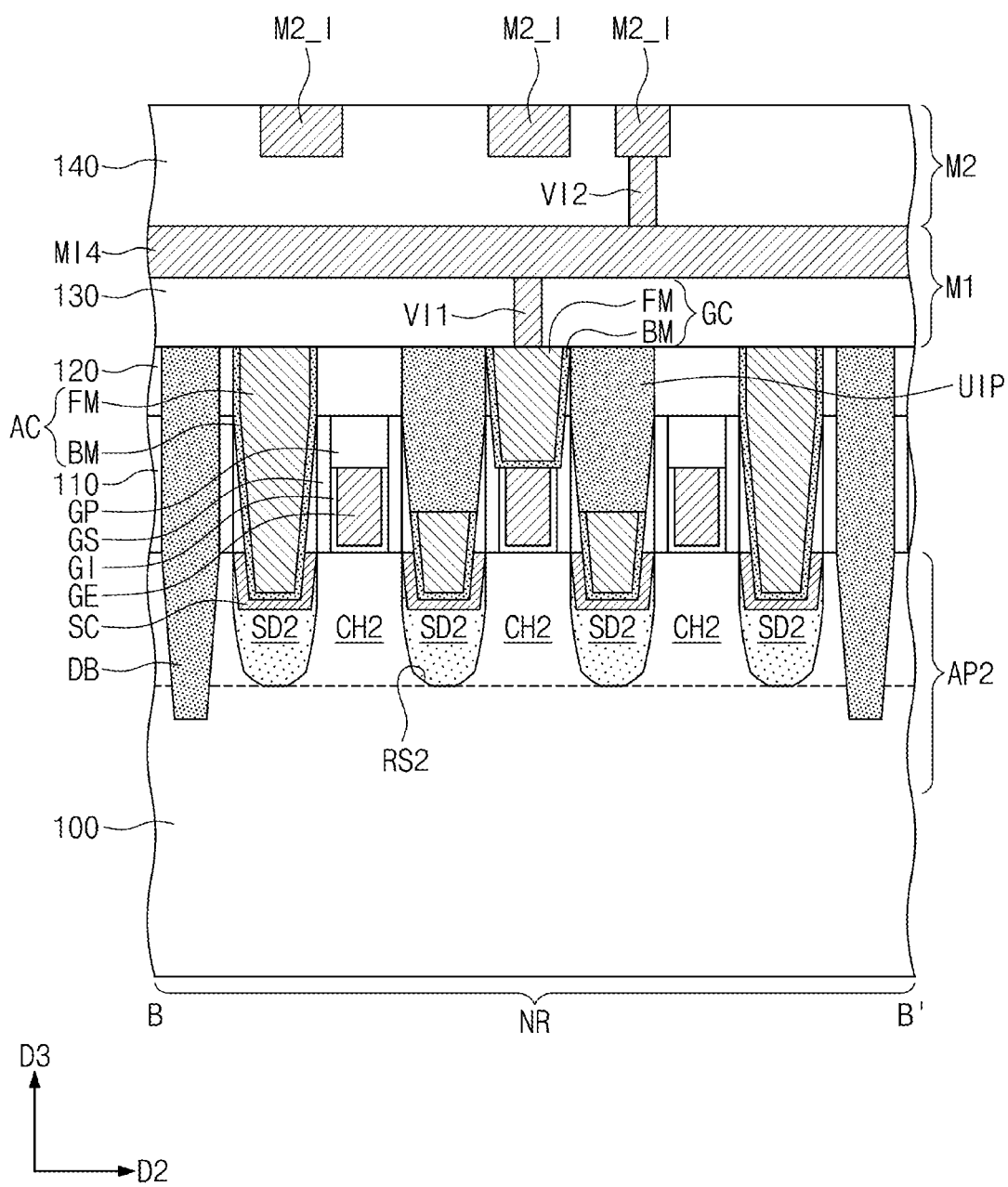
Figure 2C:
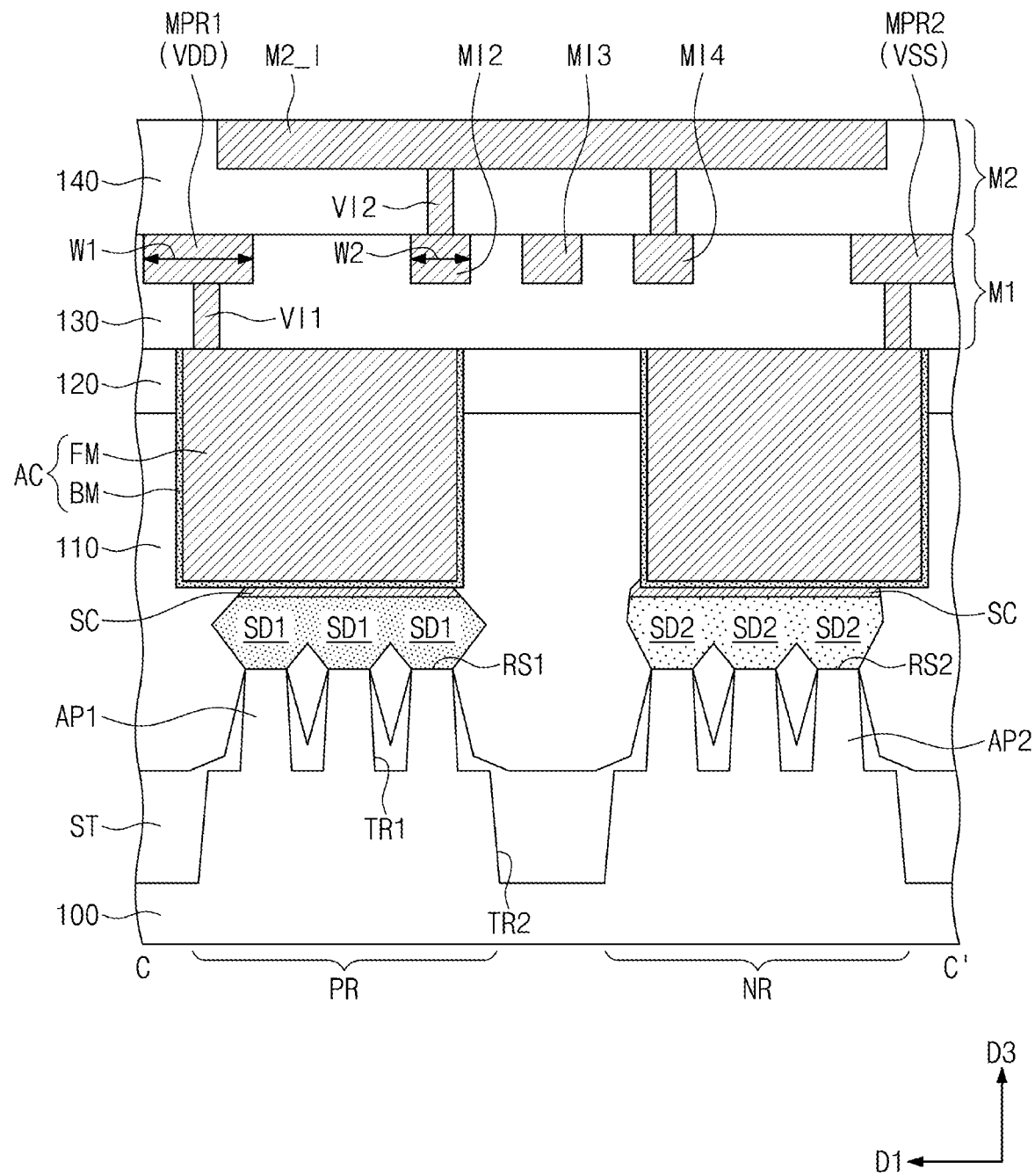
Figure 2D:
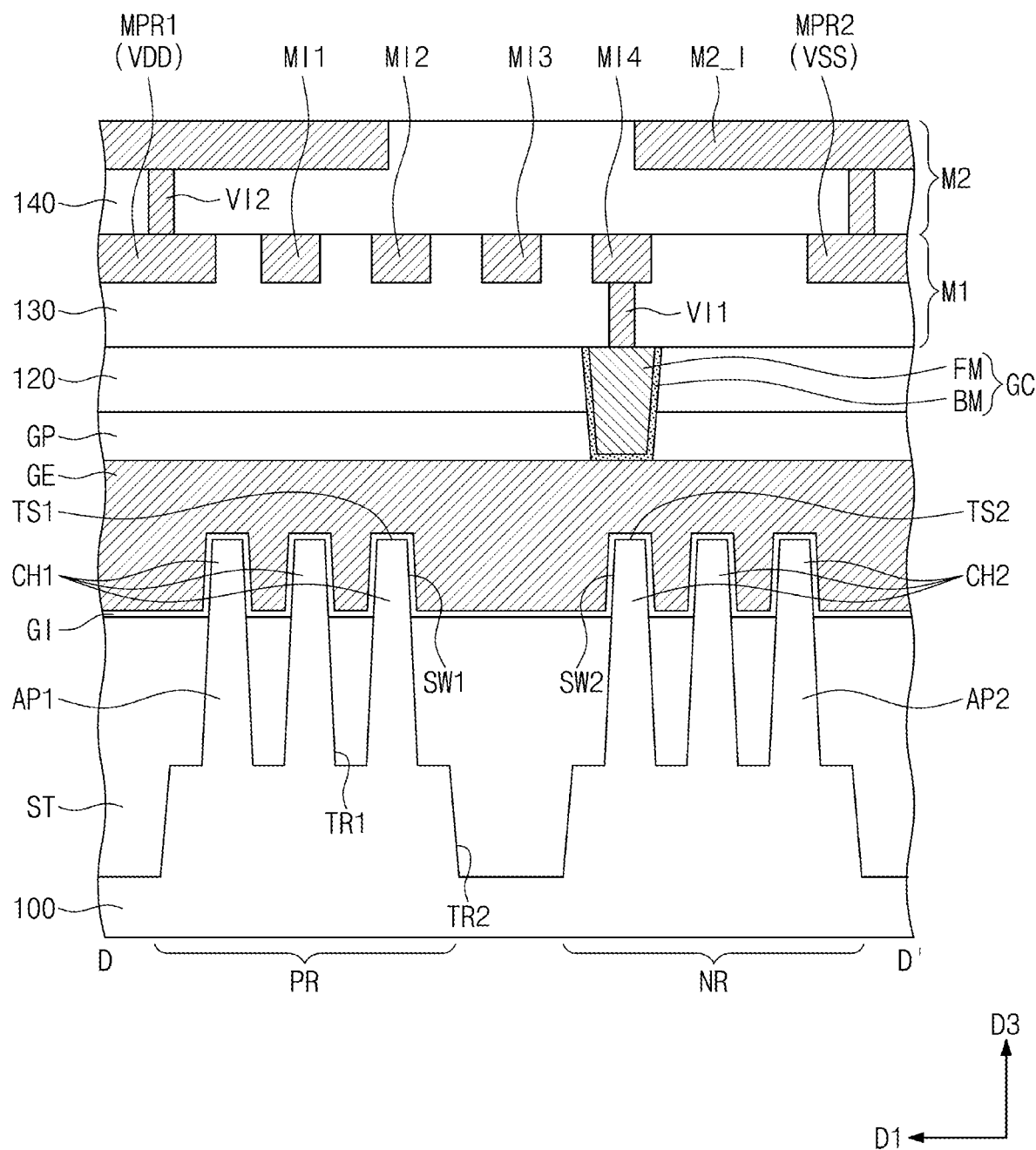

FIG. 1 illustrates a plan view of a semiconductor device according to embodiments. FIGS. 2A, 2B, 2C, and 2D illustrate cross-sectional views respectively taken along lines A-A', B-B', C-C', and D-D' of FIG. 1.

Referring to FIGS. 1 and 2A to 2D, a plurality of logic cells LC1 and LC2 may be provided on a substrate 100. The substrate 100 may be a compound semiconductor substrate or a semiconductor substrate including, e.g., silicon, germanium, or silicon-germanium. For example, the substrate 100 may be a silicon substrate.

The logic cells LC1 and LC2 may include, e.g., a first logic cell LC1 and a second logic cell LC2 that are located adjacent to each other in a second direction D2. Each of the first and second logic cells LC1 and LC2 may have logic transistors included in a logic circuit. Each of the first and second logic cells LC1 and LC2 may include a PMOSFET region PR and an NMOSFET region NR. The PMOSFET region PR and the NMOSFET region NR may be spaced apart from each other in a first direction D1.

The PMOSFET region PR and the NMOSFET region NR may be defined by a second trench TR2 formed on an upper portion of the substrate 100. The second trench TR2 may be positioned between the PMOSFET region PR and the NMOSFET region NR. The PMOSFET region PR and the NMOSFET region NR may be spaced apart from each other in the first direction D1 across the second trench TR2.

First active patterns AP1 and second active patterns AP2 may be provided on the PMOSFET region PR and the NMOSFET region NR, respectively. The first and second active patterns AP1 and AP2 may extend in parallel in the second direction D2. The first and second active patterns AP1 and AP2 may be portions of the substrate 100 that protrude in a vertical direction (or a third direction D3). A first trench TR1 may be defined between neighboring first active patterns AP1 and between neighboring second active patterns AP2. The first trench TR1 may be shallower than the second trench TR2.

A device isolation layer ST may fill the first and second trenches TR1 and TR2. The first and second active patterns AP1 and AP2 may have their upper portions that protrude vertically upwards from the device isolation layer ST (see FIG. 2D). Each of the first and second active patterns AP1 and AP2 may have a fin shape at the upper portion thereof. The device isolation layer ST may not cover any of the upper portions of the first and second active patterns AP1 and AP2. The device isolation layer ST may cover lower sidewalls of the first and second active patterns AP1 and AP2.

First source/drain patterns SD1 may be provided on the upper portions of the first active patterns AP1. First recesses RS1 may be formed on the upper portion of the first active pattern AP1. The first source/drain patterns SD1 may be provided in corresponding first recesses RS1. The first source/drain patterns SD1 may be impurity regions having a first conductivity type (e.g., p-type). A first channel pattern CH1 may be interposed between a pair of first source/drain patterns SD1. The first channel pattern CH1 may connect the pair of first source/drain patterns SD1 to each other.

Second source/drain patterns SD2 may be provided on the upper portions of the second active patterns AP2. Second recesses RS2 may be formed on the upper portion of the second active pattern AP2. The second source/drain patterns SD2 may be provided in corresponding second recesses RS2. The second source/drain patterns SD2 may be impurity regions having a second conductivity type (e.g., n-type). A second channel pattern CH2 may be interposed between a pair of second source/drain patterns SD2. The second channel pattern CH2 may connect the pair of second source/drain patterns SD2 to each other.

The first and second source/drain patterns SD1 and SD2 may be epitaxial patterns formed by a selective epitaxial growth process. For example, the first and second source/drain patterns SD1 and SD2 may have their top surfaces coplanar with those of the first and second channel patterns CH1 and CH2. In another example, the first and second source/drain patterns SD1 and SD2 may have their top surfaces higher than those of the first and second channel patterns CH1 and CH2.

The first source/drain patterns SD1 may include a semiconductor element (e.g., SiGe) whose lattice constant is greater than that of a semiconductor element of the substrate 100. Therefore, the pair of first source/drain patterns SD1 may provide a compressive stress to the first channel pattern CH1 therebetween. The second source/drain patterns SD2 may include the same semiconductor element (e.g., Si) as that of the substrate 100.

Gate electrodes GE may be provided to extend in the first direction D1, while running across the first and second active patterns AP1 and AP2. The gate electrodes GE may be arranged at a first pitch P1 along the second direction D2. The gate electrodes GE may vertically overlap the first and second channel patterns CH1 and CH2. Each of the gate electrodes GE may surround a top surface and opposite sidewalls of each of the first and second channel patterns CH1 and CH2.

Referring back to FIG. 2D, the gate electrode GE may be provided on a first top surface TS1 of the first channel pattern CH1 and on at least one first sidewall SW1 of the first channel pattern CH1. The gate electrode GE may be provided on a second top surface TS2 of the second channel pattern CH2 and on at least one second sidewall SW2 of the second channel pattern CH2. For example, a transistor according to some embodiments may be a three-dimensional field effect transistor (e.g., FinFET) in which the gate electrode GE three-dimensionally surrounds the first and second channel patterns CH1 and CH2.

A pair of gate spacers GS may be located on opposite sidewalls of each of the gate electrodes GE. The gate spacers GS may extend in the first direction D1 along the gate electrodes GE. The gate spacers GS may have their top surfaces higher than those of the gate electrodes GE. The top surfaces of the gate spacers GS may be coplanar with that of a first interlayer dielectric layer 110 which will be discussed below. The gate spacers GS may include at least one of, e.g., SiCN, SiCON, and SiN. Alternatively, the gate spacers GS may each include a multi-layer formed of at least two of, e.g., SiCN, SiCON, and SiN.

A gate capping pattern GP may be provided on the gate electrode GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include at least one of, e.g., SiON, SiCN, SiCON, and SiN.

A gate dielectric layer GI may be interposed between the gate electrode GE and the first active pattern AP1 and between the gate electrode GE and the second active pattern AP2. The gate dielectric layer GI may extend along a bottom surface of the gate electrode GE. For example, the gate dielectric layer GI may cover the first top surface TS1 and the first sidewall SW1 of the first channel pattern CH1. The gate dielectric layer GI may cover the second top surface TS2 and the second sidewall SW2 of the second channel pattern CH2. The gate dielectric layer GI may cover the top surface of the device isolation layer ST below the gate electrode GE (see FIG. 2D).

In some embodiments, the gate dielectric layer GI may include, e.g., one or more of a silicon oxide layer, a silicon oxynitride layer, and a high-k dielectric layer. The high-k dielectric layer may include a material whose dielectric constant is greater than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In some embodiments, a semiconductor device may include a negative capacitance field effect transistor that uses a negative capacitor. For example, the gate dielectric layer GI may include a ferroelectric material layer that exhibits ferroelectric properties and a paraelectric material layer that exhibits paraelectric properties.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing of less than about 60 mV/decade at room temperature.

The ferroelectric material layer may have ferroelectric properties. The ferroelectric material layer may include, e.g., at least one of hafnium oxide, hafnium zirconium oxide, barium strontium titanium oxide, and lead zirconium titanium oxide. For example, the hafnium zirconium oxide may be a material in which hafnium oxide is doped with zirconium (Zr). In another example, the hafnium zirconium oxide may be a compound of hafnium (Hf), zirconium (Zr), and oxygen (O).

The ferroelectric material layer may further include impurities doped thereinto. For example, the impurities may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of impurities included in the ferroelectric material layer may be changed depending on what ferroelectric material is included in the ferroelectric material layer.

When the ferroelectric material layer includes hafnium oxide, the ferroelectric material layer may include at least one of impurities such as gadolinium (Gd), silicon (Si), zirconium (Zr), aluminum (Al), and yttrium (Y).

When the impurities are aluminum (Al), the ferroelectric material layer may include about 3 to about 8 atomic percent aluminum. In this description, the ratio of impurities may be a ratio of aluminum to the sum of hafnium and aluminum.

When the impurities are silicon (Si), the ferroelectric material layer may include about 2 to about 10 atomic percent silicon. When the impurities are yttrium (Y), the ferroelectric material layer may include about 2 to about 10 atomic percent yttrium. When the impurities are gadolinium (Gd), the ferroelectric material layer may include about 1 to about 7 atomic percent gadolinium. When the impurities are zirconium (Zr), the ferroelectric material layer may include about 50 to about 80 atomic percent zirconium.

The paraelectric material layer may have paraelectric properties. The paraelectric material layer may include, e.g., at least one of silicon oxide and high-k metal oxide. The metal oxide included in the paraelectric material layer may include, e.g., at least one of hafnium oxide, zirconium oxide, and aluminum oxide, but embodiments are not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. The thickness of the ferroelectric material layer may range, e.g., from about 0.5 nm to about 10 nm, but embodiments are not limited thereto. Because ferroelectric materials have their own critical thickness that exhibits ferroelectric properties, the thickness of the ferroelectric material layer may depend on ferroelectric material.

For example, the gate dielectric layer GI may include a single ferroelectric material layer. In another example, the gate dielectric layer GI may include a plurality of ferroelectric layers that are spaced apart from each other. The gate dielectric layer GI may have a stack structure in which a plurality of ferroelectric material layers are alternately stacked with a plurality of paraelectric material layers.

The gate electrode GE may include a metal-containing pattern. For example, the gate electrode GE may include a first metal pattern and a second metal pattern on the first metal pattern. The first metal pattern may be provided on the gate dielectric layer GI and may be adjacent to the first and second channel patterns CH1 and CH2. The first metal pattern may include a work-function metal that controls a threshold voltage of a transistor. A thickness and composition of the first metal pattern may be adjusted to achieve a desired threshold voltage.

The first metal pattern may include a metal nitride layer. For example, the first metal pattern may include nitrogen (N) and at least one metal of titanium (Ti), tantalum (Ta), aluminum (Al), tungsten (W), and molybdenum (Mo). The first metal pattern may further include carbon (C). The first metal pattern may include a plurality of stacked work-function metal layers.

The second metal pattern may include metal whose resistance is less than that of the first metal pattern. For example, the second metal pattern may include at least one metal of tungsten (W), aluminum (Al), titanium (Ti), and tantalum (Ta).

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with those of the gate capping patterns GP and those of the gate spacers GS. The first interlayer dielectric layer 110 may be provided thereon with a second interlayer dielectric layer 120 that covers the gate capping patterns GP. A third interlayer dielectric layer 130 may be provided on the second interlayer dielectric layer 120. A fourth interlayer dielectric layer 140 may be provided on the third interlayer dielectric layer 130. For example, the first to fourth interlayer dielectric layers 110 to 140 may include a silicon oxide layer.

Each of the first and second logic cells LC1 and LC2 may be provided on its opposite sides with a pair of separation structures DB that face each other in the second direction D2. For example, the separation structure DB may be provided on a boundary between the first and second logic cells LC1 and LC2. The separation structure DB may extend in the first direction D1 parallel to the gate electrodes GE. The separation structure DB and its adjacent gate electrode GE may be arranged at a pitch the same as the first pitch P1.

The separation structure DB may penetrate the first and second interlayer dielectric layers 110 and 120, and may extend into the first and second active patterns AP1 and AP2. The separation structure DB may penetrate the upper portion of each of the first and second active patterns AP1 and AP2. The separation structure DB may separate the PMOSFET and NMOSFET regions PR and NR of the first logic cell LC1 from the PMOSFET and NMOSFET regions PR and NR of the second logic cell LC2.

Active contacts AC may be provided to penetrate the first and second interlayer dielectric layers 110 and 120 and to correspondingly have electrical connection with the first and second source/drain patterns SD1 and SD2. A pair of active contacts AC may be provided on opposite sides of the gate electrode GE. When viewed in plan, the active contact AC may have a bar shape that extends in the first direction D1.

The active contact AC may be a self-aligned contact. For example, the gate capping pattern GP and the gate spacer GS may be used to form the active contact AC in a self-alignment manner. The active contact AC may cover, e.g., at least a portion of a sidewall of the gate spacer GS. Although not shown, the active contact AC may cover a portion of the top surface of the gate capping pattern GP.

Silicide patterns SC may be correspondingly interposed between the active contact AC and the first source/drain pattern SD1 and between the active contact AC and the second source/drain pattern SD2. The active contact AC may be electrically connected through the silicide pattern SC to one of the first and second source/drain patterns SD1 and SD2. The silicide pattern SC may include metal silicide, e.g., at least one of titanium silicide, tantalum silicide, tungsten silicide, nickel silicide, and cobalt silicide.

A gate contact GC may be provided to penetrate the second interlayer dielectric layer 120 and the gate capping pattern GP and to have electrical connection with the gate electrode GE. For example, referring to FIG. 2B, an upper dielectric pattern UIP may fill an upper portion of each of the active contacts AC, which upper portion is adjacent to the gate contact GC. Therefore, it may be possible to prevent process failure, e.g., an electrical short caused by contact between the gate contact GC and its adjacent active contact AC.

Each of the active contact AC and the gate contact GC may include a conductive pattern FM and a barrier pattern BM that surrounds the conductive pattern FM. For example, the conductive pattern FM may include at least one metal of aluminum, copper, tungsten, molybdenum, and cobalt. The barrier pattern BM may cover sidewalls and a bottom surface of the conductive pattern FM. The barrier pattern BM may include a combination of a metal layer and a metal nitride layer. The metal layer may include at least one of titanium, tantalum, tungsten, nickel, cobalt, and platinum. The metal nitride layer may include at least one of a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A first metal layer M1 may be provided in the third interlayer dielectric layer 130. The first metal layer M1 may include first and second power lines MPR1 and MPR2, first to fifth lower lines MI1 to MI5, and lower vias VI1. The lower vias VI1 may be provided below the first and second power lines MPR1 and MPR2 and the first to fifth lower lines MI1 to MI5.

The first and second power lines MPR1 and MPR2 may extend in parallel in the second direction D2, while running across the first and second logic cells LC1 and LC2. A drain voltage VDD and a source voltage VSS may be applied to the first power line MPR1 and the second power line MPR2, respectively.

Referring to FIG. 1, on each of the first and second logic cells LC1 and LC2, a first cell boundary CB1 may be defined to extend in the second direction D2. On a location opposite to that of the first cell boundary CB1, a second cell boundary CB2 may be defined to extend in the second direction D2. The first cell boundary CB1 may be provided thereon with the first power line MPR1 to which the drain voltage VDD is applied. For example, the first power line MPR1 to which the drain voltage VDD is applied may extend in the second direction D2 along the first cell boundary CB1. The second cell boundary CB2 may be provided thereon with the second power line MPR2 to which is applied the source voltage VSS or ground voltage. For example, the second power line MPR2 to which the source voltage VSS is applied may extend in the second direction D2 along the second cell boundary CB2.

The first to fifth lower lines MI1 to MI5 may be located between the first power line MPR1 and the second power line MPR2. For example, first to fifth wiring tracks MTR1 to MTR5 may be defined between the first power line MPR1 and the second power line MPR2. The first to fifth wiring tracks MTR1 to MTR5 may extend in parallel in the second direction D2. The first to fifth lower lines MI1 to MI5 may be arranged at a second pitch P2 along the first direction D1. The second pitch P2 may be less than the first pitch P1.

One or more first lower lines MI1 may be located on the first wiring track MTR1, one or more second lower lines MI2 may be located on the second wiring track MTR2, one or more third lower lines MI3 may be located on the third wiring track MTR3, one or more fourth lower lines MI4 may be located on the fourth wiring track MTR4, and one or more fifth lower lines MI5 may be located on the fifth wiring track MTR5. The first to fifth lower lines MI1 to MI5 may extend in parallel in the second direction D2 along the first to fifth wiring tracks MTR1 to MTR5, respectively. When viewed in plan, each of the first to fifth lower lines MI1 to MI5 may have a linear or bar shape along the second direction D2.

A first width W1 may be given as a line-width, e.g., in the first direction D1, of each of the first and second power lines MPR1 and MPR2. A second width W2 may be given as a line-width, e.g., in the first direction D1, of each of the first to fifth lower lines MI1 to MI5. The second width W2 may be less than the first width W1 (see FIG. 2C). For example, the second width W2 may be less than about 12 nm, and the first width W1 may be greater than about 12 nm.

The lower vias VI1 may be interposed between the active contacts AC and the first and second power lines MPR1 and MPR2. The lower vias VI1 may be interposed between the first to fifth lower lines MI1 to MI5 and the active and gate contacts AC and GC. For example, the first and second power lines MPR1 and MPR2 and the first to fifth lower lines MI1 to MI5 may include metal, e.g., at least one of copper (Cu), aluminum (Al), ruthenium (Ru), cobalt (Co), tungsten (W), and molybdenum (Mo).

A certain one of the lines MPR1, MPR2, and MI1 to MI5 and its underlying lower via VI1 of the first metal layer M1 may be formed by individual processes. For example, the lines MPR1, MPR2, and MI1 to MI5 and the lower vias VI1 of the first metal layer M1 may each be formed by a single damascene process. A sub-20 nm process may be employed to fabricate a semiconductor device according to some embodiments.

A second metal layer M2 may be provided in the fourth interlayer dielectric layer 140. The second metal layer M2 may include upper lines M2_I. Each of the upper lines M2_I may have a linear or bar shape that extends in the first direction D1. For example, the upper lines M2_I may extend in parallel in the first direction D1.

The second metal layer M2 may further include upper vias VI2. The upper vias VI2 may be provided below the upper lines M2_I. The upper vias VI2 may be correspondingly interposed between the upper lines M2_I and the lines MPR1, MPR2, and MI1 to MI5 of the first metal layer M1.

The upper line M2_I and its underlying upper via VI2 of the second metal layer M2 may be formed into a single piece in the same process. For example, a dual damascene process may be employed to form the upper line M2_I simultaneously with the upper via VI2 of the second metal layer M2. The upper lines M2_I may include metal, e.g., at least one of copper (Cu), aluminum (Al), ruthenium (Ru), cobalt (Co), tungsten (W), and molybdenum (Mo).

In some embodiments, metal layers (e.g., M3, M4, M5, etc.) may be additionally stacked on the fourth interlayer dielectric layer 140. Each of the stacked metal layers may include routing lines.

Figure 3:
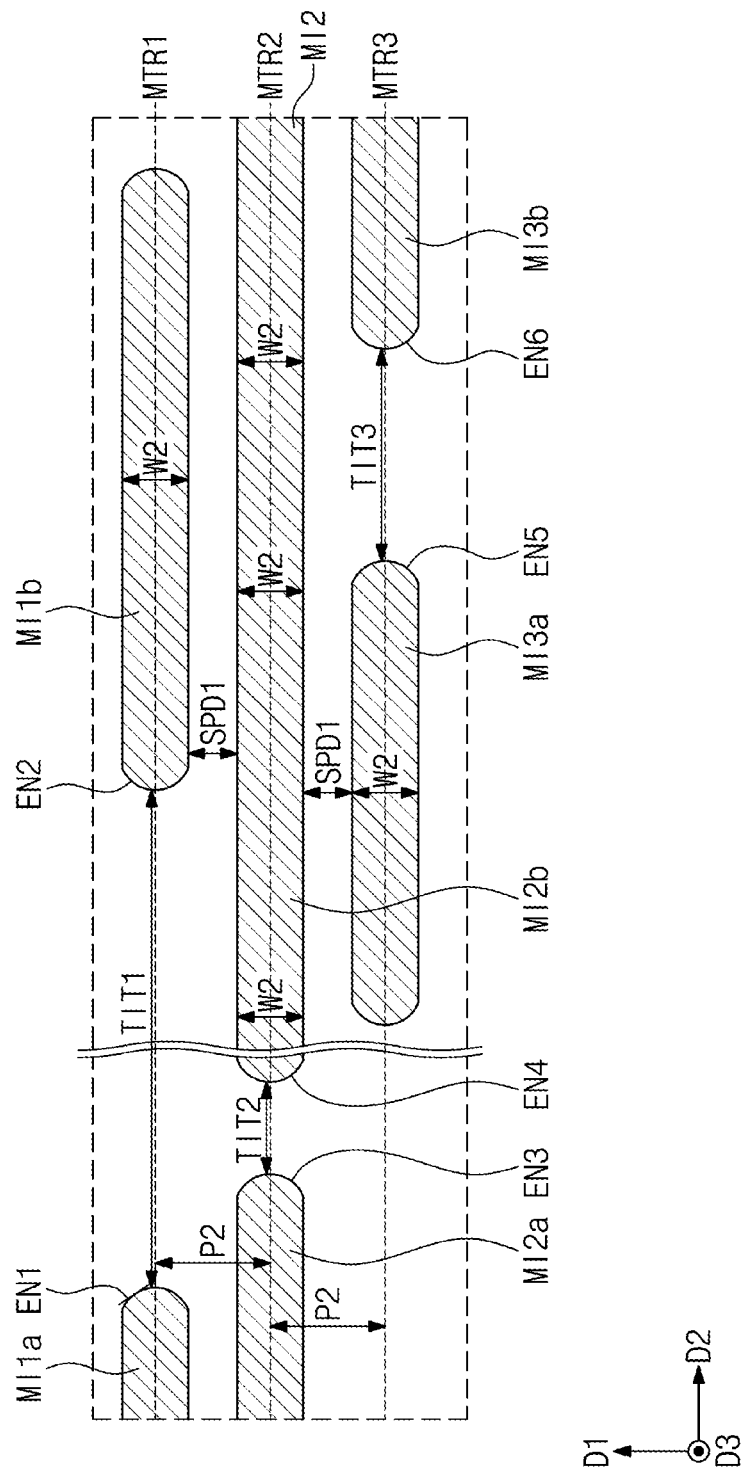
FIG. 3 illustrates a plan view of first, second, and third lower lines respectively located on first, second, and third wiring tracks of FIG. 1.

FIG. 3 illustrates a plan view showing first, second, and third lower lines respectively located on first, second, and third wiring tracks of FIG. 1. Referring to FIG. 3, the first lower lines MI1 located on the first wiring track MTR1 may include a first line MI1a and a second line MI1b.

The first line MI1a may have a first end EN1 at a tip thereof, and the second line MI1b may have a second end EN2 at a tip thereof. The first end EN1 of the first line MI1a and the second end EN2 of the second line MI1b may face each other in the second direction D2.

A first distance TIT1 may be provided between the first end EN1 of the first line MI1a and the second end EN2 of the second line MI1b. The first distance TIT1 may be a distance between the tip of the first line MI1a and the tip of the second line MI1b (i.e., tip to tip). The first distance TIT1 may be relatively large. The first distance TIT1 may be greater than a second distance TIT2 which will be discussed below.

A curved profile may be given to the first end EN1 of the first line MI1a and the second end EN2 of the second line MI1b. For example, the first end EN1 of the first line MI1a may have a curvature substantially the same as that of the second end EN2 of the second line MI1b. In another example, the first end EN1 of the first line MI1a may have a curvature different from that of the second end EN2 of the second line MI1b.

The second lower lines MI2 located on the second wiring track MTR2 may include a third line MI2a and a fourth line MI2b.

The third line MI2a may have a third end EN3 at a tip thereof, and the fourth line MI2b may have a fourth end EN4 at a tip thereof. The third end EN3 of the third line MI2a and the fourth end EN4 of the fourth line MI2b may face each other in the second direction D2.

A second distance TIT2 may be provided between the third end EN3 of the third line MI2a and the fourth end EN4 of the fourth line MI2b. The second distance TIT2 may be a distance between the tip of the third line MI2a and the tip of the fourth line MI2b. The second distance TIT2 may be relatively small. The second distance TIT2 may be less than a third distance TIT3 which will be discussed below.

A curved profile may be given to the third end EN3 of the third line MI2a and the fourth end EN4 of the fourth line MI2b. For example, the third end EN3 of the third line MI2a may have a curvature substantially the same as that of the fourth end EN4 of the fourth line MI2b. In another example, the third end EN3 of the third line MI2a may have a curvature different from that of the fourth end EN4 of the fourth line MI2b.

The third lower lines MI3 located on the third wiring track MTR3 may include a fifth line MI3a and a sixth line MI3b.

The fifth line MI3a may have a fifth end EN5 at a tip thereof, and the sixth line MI3b may have a sixth end EN6 at a tip thereof. The fifth end EN5 of the fifth line MI3a and the sixth end EN6 of the sixth line MI3b may face each other in the second direction D2.

A third distance TIT3 may be provided between the fifth end EN5 of the fifth line MI3a and the sixth end EN6 of the sixth line MI3b. The third distance TIT3 may be a distance between the tip of the fifth line MI3a and the tip of the sixth line MI3b. The first, second, and third distances TIT1, TIT2, and TIT3 may be different from each other.

A curved profile may be given to the fifth end EN5 of the fifth line MI3a and the sixth end EN6 of the sixth line MI3b. For example, the fifth end EN5 of the fifth line MI3a may have a curvature substantially the same as that of the sixth end EN6 of the sixth line MI3b. In another example, the fifth end EN5 of the fifth line MI3a may have a curvature different from that of the sixth end EN6 of the sixth line MI3b.

The first, second, third, fourth, fifth, and sixth lines MI1a, MI1b, MI2a, MI2b, MI3a, and MI3b may have the same width W2, e.g., in the first direction D1. Each of the first, second, third, fourth, fifth, and sixth lines MI1a, MI1b, MI2a, MI2b, MI3a, and MI3b may extend in the second direction D2, while maintaining the same width W2. The width W2 of each of the first, second, third, fourth, fifth, and sixth lines MI1a, MI1b, MI2a, MI2b, MI3a, and MI3b may decrease, but not increase, at a corresponding one of the first, second, third, fourth, fifth, and sixth ends EN1, EN2, EN3, EN4, EN5, and EN6, e.g., due to the curvature. For example, as illustrated in FIG. 3, the first, second, third, fourth, fifth, and sixth lines MI1a, MI1b, MI2a, MI2b, MI3a, and MI3b may have constant widths, with the exception of most outer edges thereof that are curved, and therefore, have decreasing widths.

The pitch P2 between the first and second lower lines MI1 and MI2 may be the same as the pitch P2 between the second and third lower line MI2 and MI3. An interval SPD1, e.g., a distance between parallel sidewalls that are facing each other in the first direction D1, between the first and second lower lines MI1 and MI2 may be the same as an interval SPD1 between the second and third lower lines MI2 and MI3.

Figure 4:
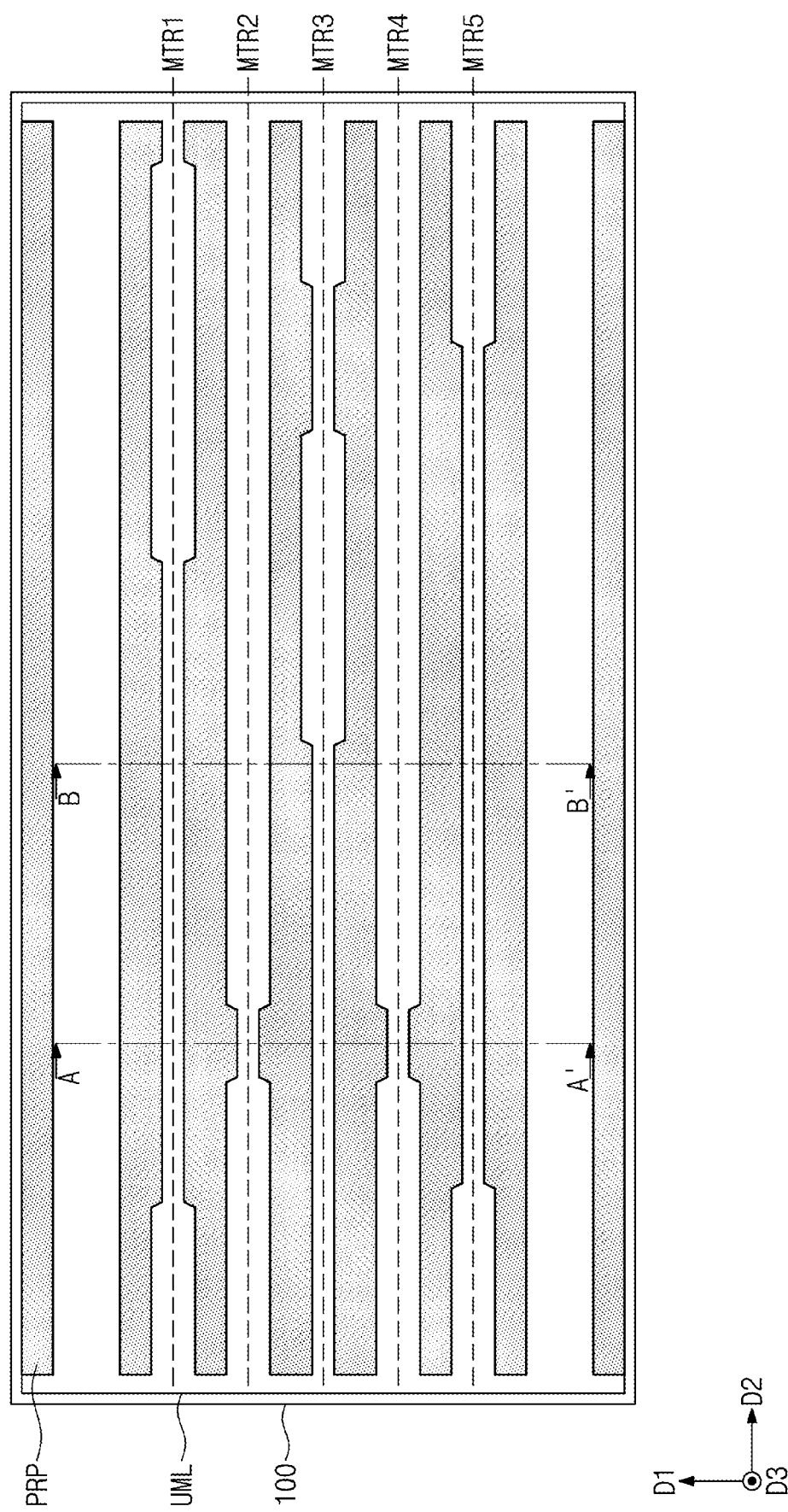
FIGS. 4, 7, 10, 12, 14, and 16 illustrate plan views of stages in a method of fabricating a semiconductor device according to embodiments.

FIGS. 4, 7, 10, 12, 14, and 16 illustrate plan views of stages in a method of fabricating a semiconductor device according to some embodiments. FIGS. 5A, 8A, 11A, 13A, 15A, and 17A illustrate cross-sectional views taken along line A-A' of FIGS. 4, 7, 10, 12, 14, and 16, respectively. FIGS. 5B, 8B, 11B, 13B, 15B, and 17B illustrate cross-sectional views taken along line B-B' of FIGS. 4, 7, 10, 12, 14, and 16, respectively. FIG. 6 illustrates a plan view of photoresist patterns on a structure of FIG. 4, and FIG. 9 illustrates a plan view of upper mask patterns in a structure of FIG. 7.

Figure 5A:
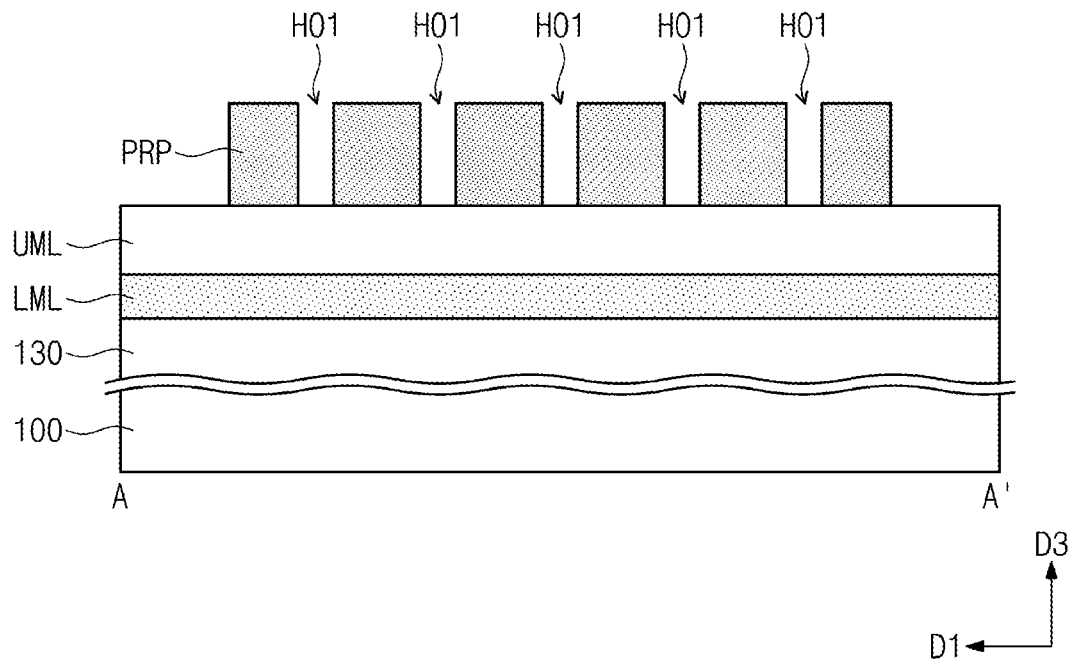
FIGS. 5A, 8A, 11A, 13A, 15A, and 17A illustrate cross-sectional views taken along line A-A' of FIGS. 4, 7, 10, 12, 14, and 16, respectively.
Figure 5B:
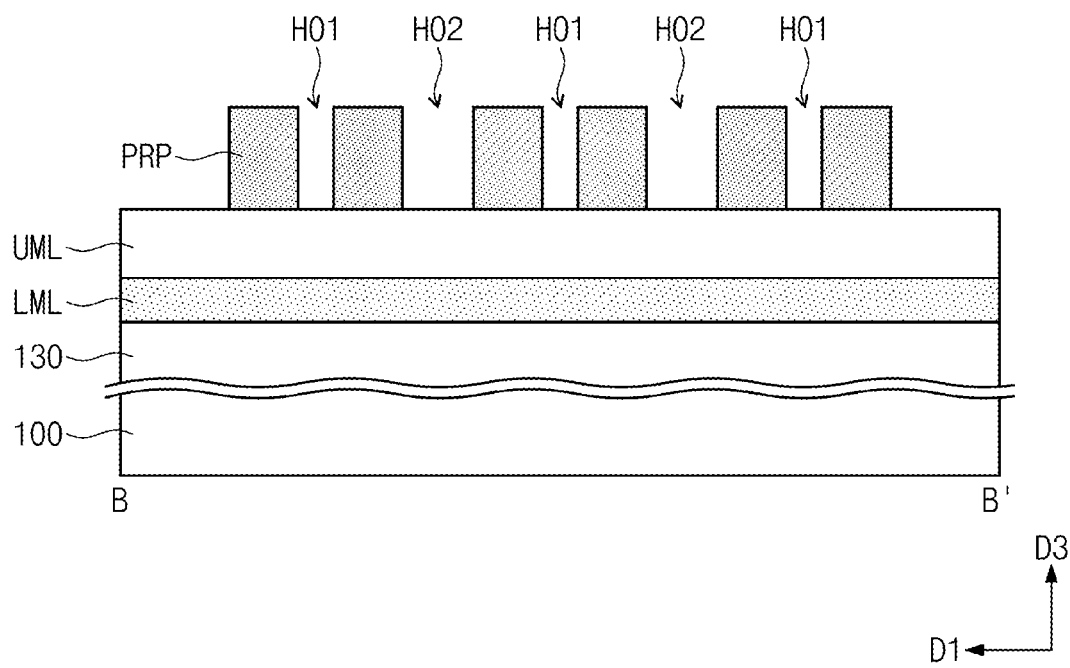
FIGS. 5B, 8B, 11B, 13B, 15B, and 17B illustrate cross-sectional views taken along line B-B' of FIGS. 4, 7, 10, 12, 14, and 16, respectively.
Figure 6:
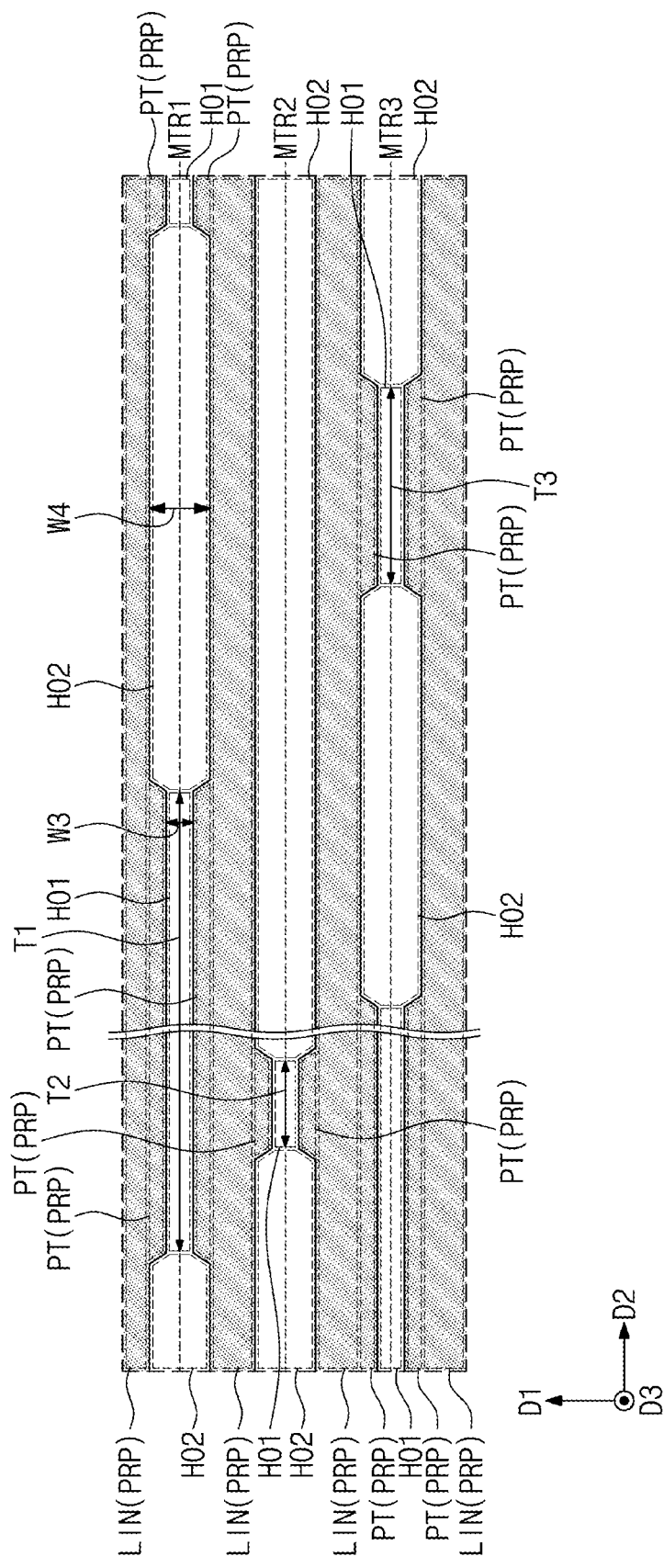
FIG. 6 illustrates a plan view of photoresist patterns on the structure of FIG. 4.

Referring to FIGS. 4, 5A, and 5B, logic transistors may be formed on the substrate 100 which are discussed above with reference to FIGS. 1A and 2A to 2D. The third interlayer dielectric layer 130 may be formed on the logic transistors. A lower mask layer LML, an upper mask layer UML, and a photoresist layer may be sequentially formed on the third interlayer dielectric layer 130. Each of the lower and upper mask layers LML and UML may include a hardmask material.

A patterning process may be performed in which the photoresist layer is patterned to form a photoresist pattern PRP on the upper mask layer UML. The patterning process may be a photolithography process. A plurality of photoresist patterns PRP may be formed to extend in parallel in the second direction D2. The photoresist patterns PRP may be arranged in the first direction D1. First to fifth wiring tracks MTR1 to MTR5 may be located between neighboring photoresist patterns PRP.

According to some embodiments, the patterning process may include a lithography process that uses an extreme ultraviolet (EUV) radiation. In this description, the EUV refers to an ultraviolet ray having a wavelength of about 4 nm to about 124 nm, e.g., about 4 nm to about 20 nm, e.g., about 13.5 nm. The EUV may denote light whose energy is in the range of about 6.21 eV to about 124 eV, e.g., about 90 eV to about 95 eV.

The lithography process that uses the EUV may include exposure and development processes that use the EUV irradiated onto the photoresist layer. For example, the photoresist layer may be an organic photoresist that contains an organic polymer, e.g., polyhydroxystyrene. The organic photoresist may further include a photosensitive compound that is sensitive to the EUV. The organic photoresist may additionally include a material whose EUV absorption coefficient is high, e.g., an organometallic material, an iodine-containing material, or a fluorine-containing material. In another example, the photoresist layer may be an inorganic photoresist that contains an inorganic material, e.g., tin oxide.

The photoresist layer may be formed to have a relatively small thickness. The photoresist patterns PRP may be formed by developing the photoresist layer exposed to the EUV. When viewed in plan, the photoresist patterns PRP may each have, e.g., a linear shape that extends in one direction, an island shape, a zigzag shape, a honeycomb shape, or a circular shape, but embodiments are not limited thereto.

As discussed below, the photoresist patterns PRP may be used as an etching mask to pattern one or more mask layers stacked below the photoresist patterns PRP, and thus mask patterns may be formed. The mask patterns may be used as an etching mask to pattern a target layer to form desired patterns on a wafer.

As a comparative example, a multi-patterning technique (MPT), which could potentially be used to form mask patterns, requires the use of two or more photomasks to form fine-pitched patterns on a wafer. In contrast, when the EUV lithography process is performed according to some embodiments, only a single photomask is used to form fine-pitched patterns.

A value equal to or less than about 45 nm may be given as a minimum pitch between patterns achieved by the EUV lithography process according to some embodiments. Hence, the EUV lithography process may be sufficient to form very fine patterns without requiring the multi-patterning technique.

The following will focus on the photoresist patterns PRP with reference to FIG. 6. Each of the photoresist patterns PRP adjacent to the first to fifth wiring tracks MTR1 to MTR5 may include a line part LIN and a protruding part PT. The photoresist pattern PRP may have the line part LIN at a portion that extends in the second direction D2. The photoresist pattern PRP may have the protruding part PT at a portion that protrudes from the line part LIN toward an adjacent photoresist pattern PRP. The protruding part PT may have a width that decreases in a direction toward an adjacent photoresist pattern PRP. For example, as illustrated in FIG. 6, the protruding part PT may protrude from the line part LIN in the first direction D1, while longitudinal directions of both the line part LIN and the protruding part PT may extend in the second direction D1. For example, as further illustrated in FIG. 6, a width of the protruding part PT in the second direction D2 may decrease, as a distance from the line part LIN in the first direction increases.

A first space HO1 may be provided between the protruding parts PT of neighboring photoresist patterns PRP. A second space HO2 may be provided between the line parts LIN of neighboring photoresist patterns PRP.

The first space HO1 may extend in the second direction D2, while maintaining a constant width in the first direction D1. The first space HO1 may have a width W3 less than a width W4 of the second space HO2 in the first direction D1. The second space HO2 may extend in the second direction D2 while maintaining the width W4 in the first direction D1. The width W4 may decrease in a direction adjacent to (or toward) the first space HO1.

The first space HO1 on the first wiring track MTR1 may have a first length T1, e.g., in the second direction D2. The first space HO1 on the second wiring track MTR2 may have a second length T2, e.g., in the second direction D2. The first space HO1 on the third wiring track MTR3 may have a third length T3, e.g., in the second direction D2. The first distance TIT1, the second distance TIT2, and the third distance TIT3 discussed above with reference to FIG. 3 may correspond to the first length T1, the second length T2, and the third length T3, respectively. For example, the length of the first space HO1 may be adjusted to change a distance between tips of wiring lines which will be subsequently formed.

Figure 7:
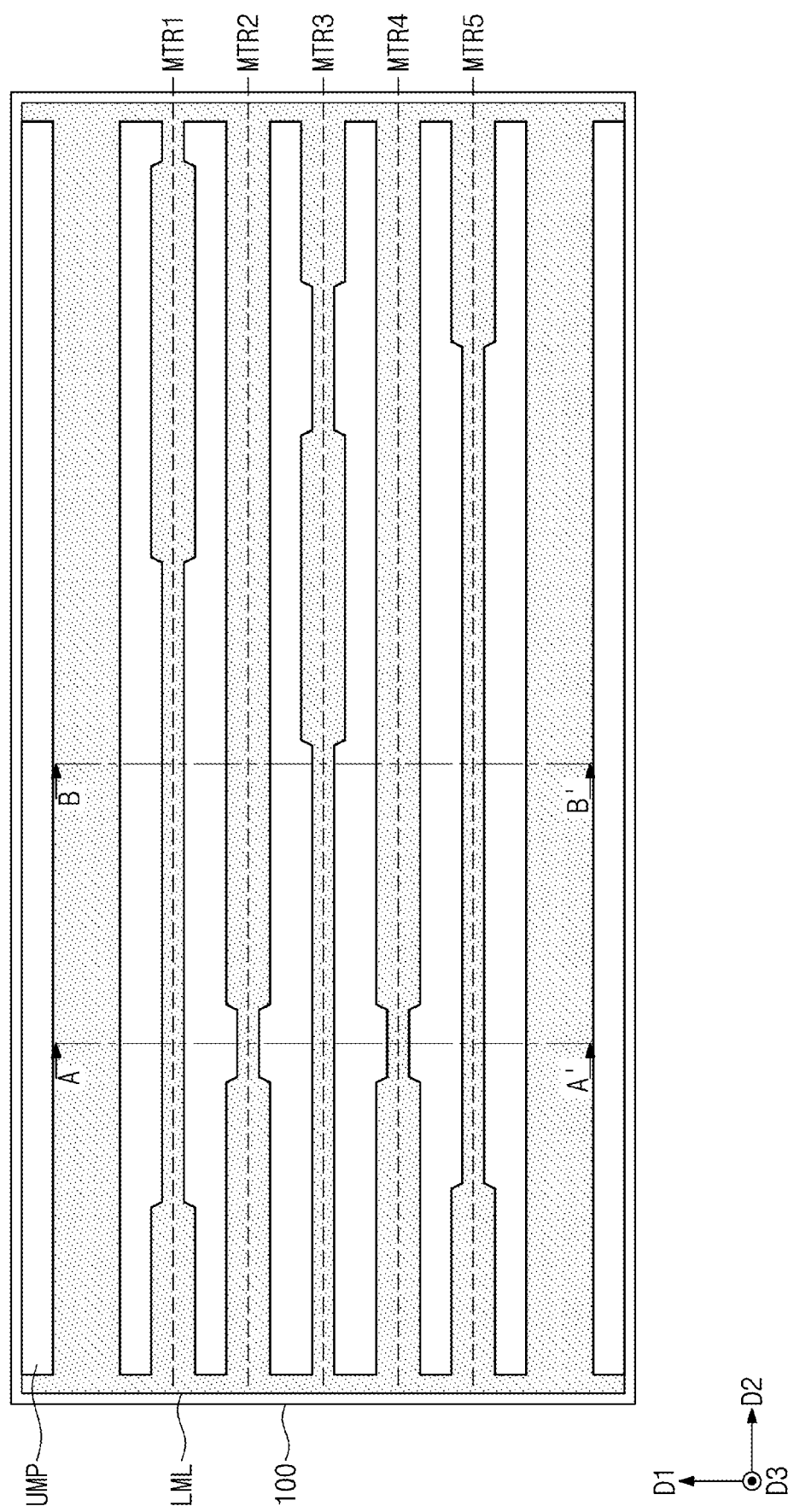
Figure 8A:
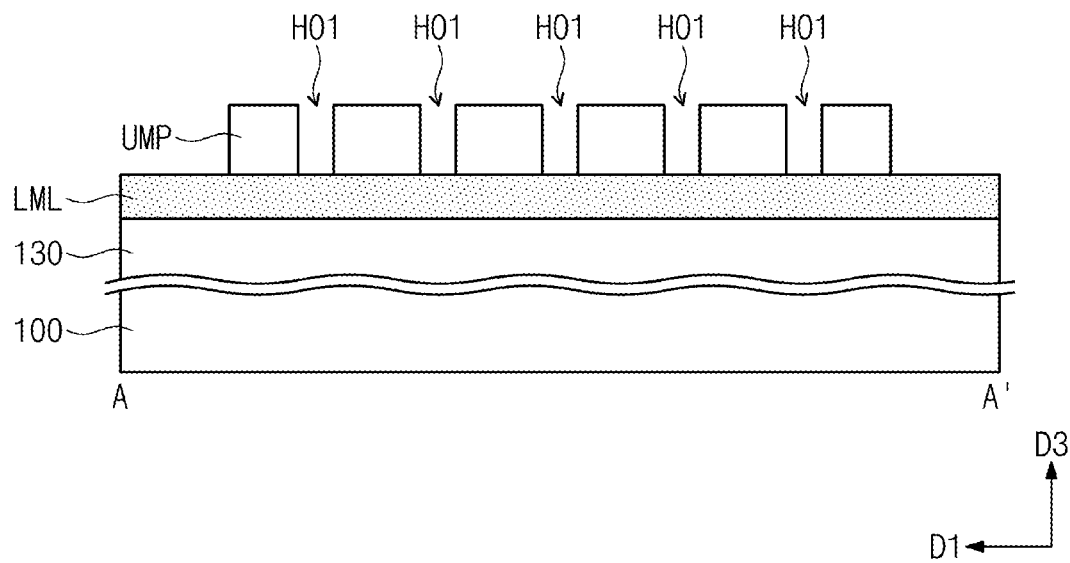
Figure 8B:
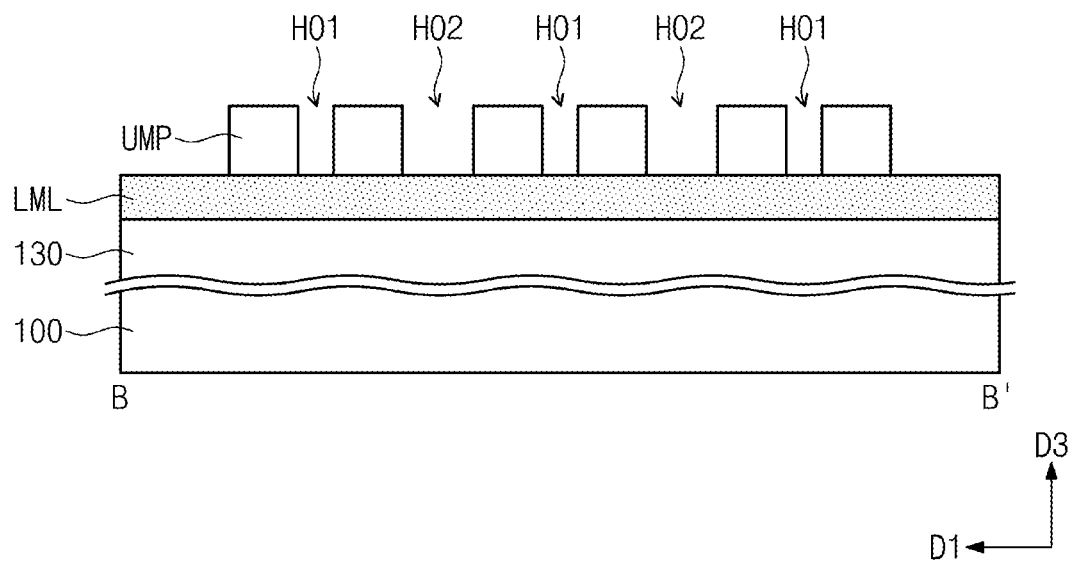
Figure 9:
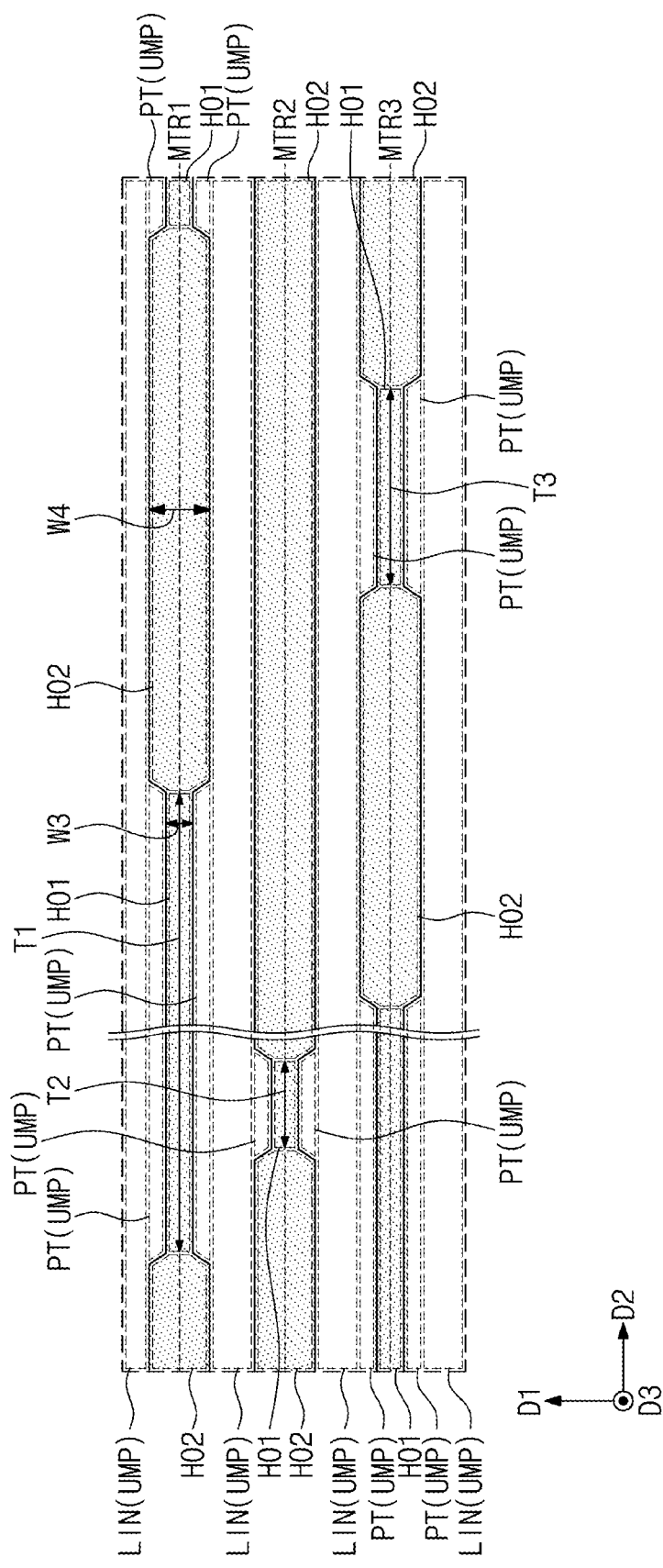
FIG. 9 illustrates a plan view of upper mask patterns on the structure of FIG. 7.

Referring to FIGS. 7, 8A, and 8B, the photoresist patterns PRP may be used as an etching mask to etch the upper mask layer UML to form upper mask patterns UMP. The upper mask patterns UMP may have a shape that corresponds to that of the photoresist patterns PRP.

The following will focus on the upper mask pattern UMP with reference to FIG. 9. Each of the upper mask patterns UMP adjacent to the first to fifth wiring tracks MTR1 to MTR5 may include a line part LIN and a protruding part PT. The upper mask pattern UMP may have the line part LIN at a portion that extends in the second direction D2. The upper mask pattern UMP may have the protruding part PT at a portion that protrudes from the line part LIN toward an adjacent upper mask pattern UMP. The protruding part PT may have a width that decreases in a direction toward an adjacent upper mask pattern UMP.

The first space HO1 may be provided between the protruding parts PT of neighboring upper mask patterns UMP. The second space HO2 may be provided between the line parts LIN of neighboring upper mask patterns UMP.

The first space HO1 may extend in the second direction D2, while maintaining a constant width. The first space HO1 may have the width W3 less than the width W4 of the second space HO2. The second space HO2 may extend in the second direction D2 while maintaining the width W4 constant, and then the width W4 may decrease, e.g., at edges of the second spacer HO2, in a direction adjacent to (or toward) the first space HO1. The width W4 may correspond to the width W2 in FIG. 2C.

The first space HO1 on the first wiring track MTR1 may have the first length T1. The first space HO1 on the second wiring track MTR2 may have the second length T2. The first space HO1 on the third wiring track MTR3 may have the third length T3. The first distance TIT1, the second distance TIT2, and the third distance TIT3 discussed above with reference to FIG. 3 may correspond to the first length T1, the second length T2, and the third length T3, respectively.

Figure 10:
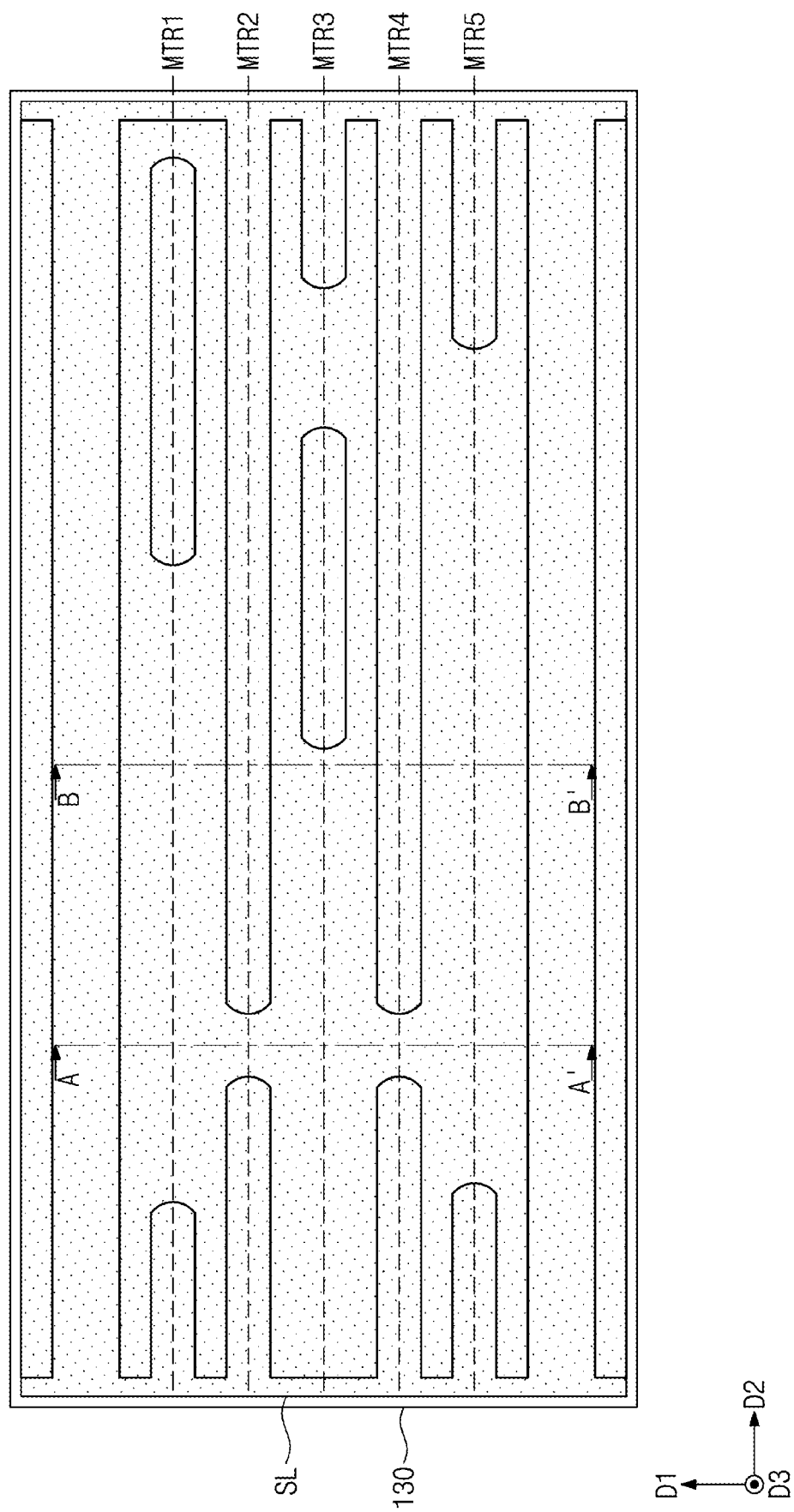
Figure 11A:
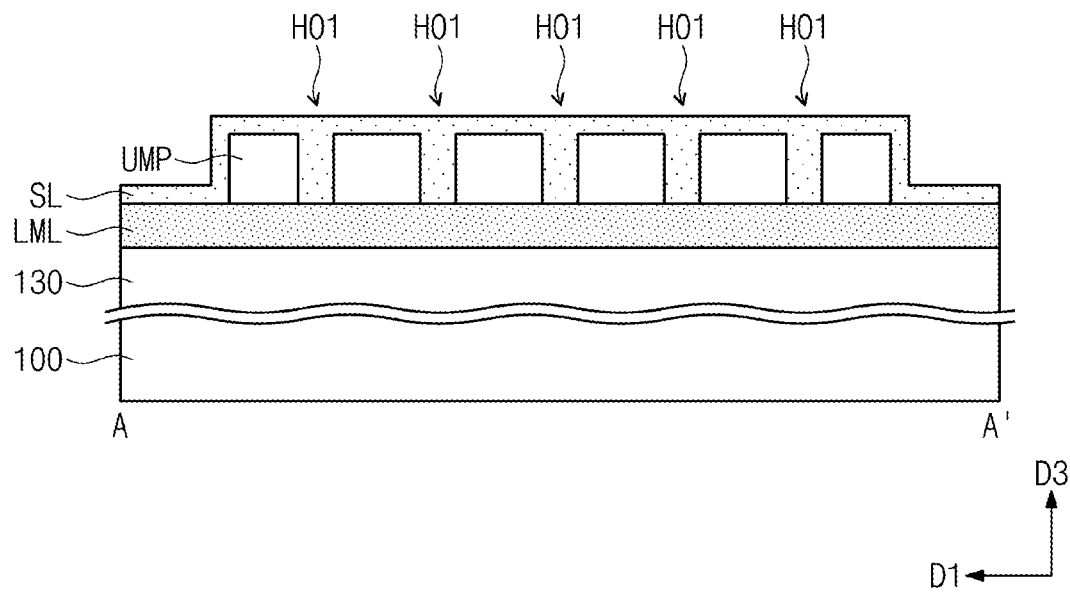
Figure 11B:
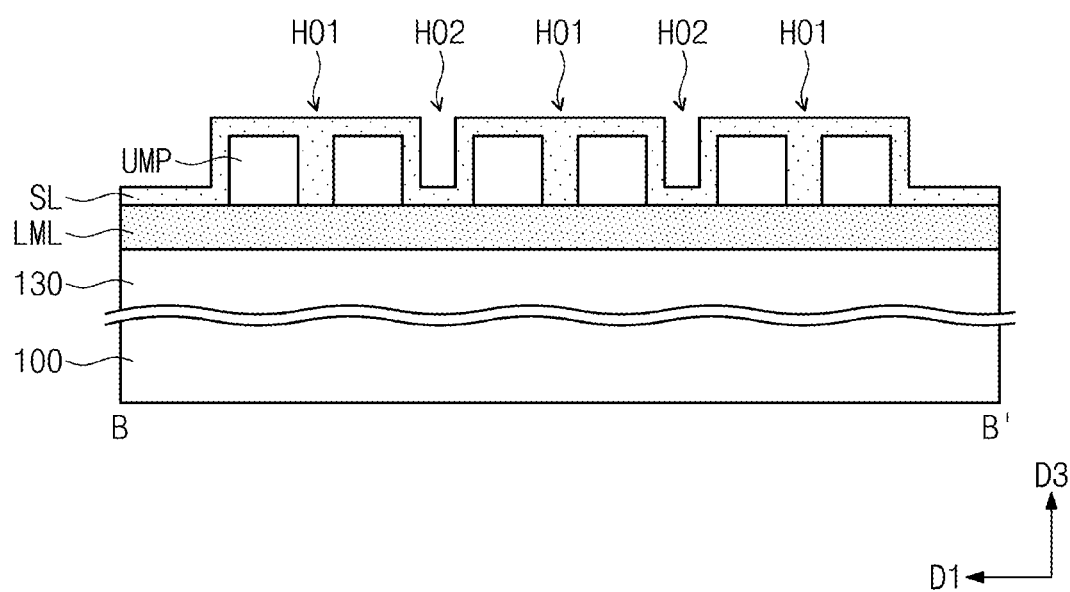

Referring to FIGS. 10, 11A, and 11B, a spacer layer SL may be formed on an entire surface of the lower mask layer LML. The spacer layer SL may cover a top surface of the lower mask layer LML, and may also cover a top surface and a sidewall of the upper mask pattern UMP. For example, the spacer layer SL may include silicon oxide (SiOx). The spacer layer SL may be formed by using an atomic layer deposition (ALD) process. The spacer layer SL may be conformally formed on the lower mask layer LML and the upper mask pattern UMP. When the spacer layer SL is formed, a cycle of the ALD process may be changed based on a width of the first space HO1.

The spacer layer SL may completely fill the first space HO1, e.g., due to the small width of the first small space HO1. The spacer layer SL may partially fill the second space HO2. As the spacer layer SL completely fills the first space HO1, the spacer layer SL may, e.g., completely, separate from each other the second spaces HO2 that are adjacent to each other in the second direction D2 on any one of the wiring tracks MTR1, MTR2, and MTR3, e.g., without requiring cutting or other additional processes.

According to some embodiments, the conformally formed spacer layer SL may completely fill the first space HO1 that is a narrow gap between neighboring upper mask patterns UMP. Therefore, finally formed wiring lines may be spaced apart from each other (tip to tip).

In general, in a case of a prior cutting process, a process variance may cause that finally formed wiring lines are connected without being spaced apart from each other, and/or may cause disconnection between neighboring wiring lines. In contrast, according to some embodiments, as the spacer layer SL is formed by using atomic layer deposition, it may be possible to reduce the process variance. As a result, a semiconductor device may increase in electrical characteristics. Moreover, the spacer layer SL may be formed by using atomic layer deposition that is a relatively simple process, and this may result in a simplified process, e.g., as compared to the prior cutting process.

Figure 12:
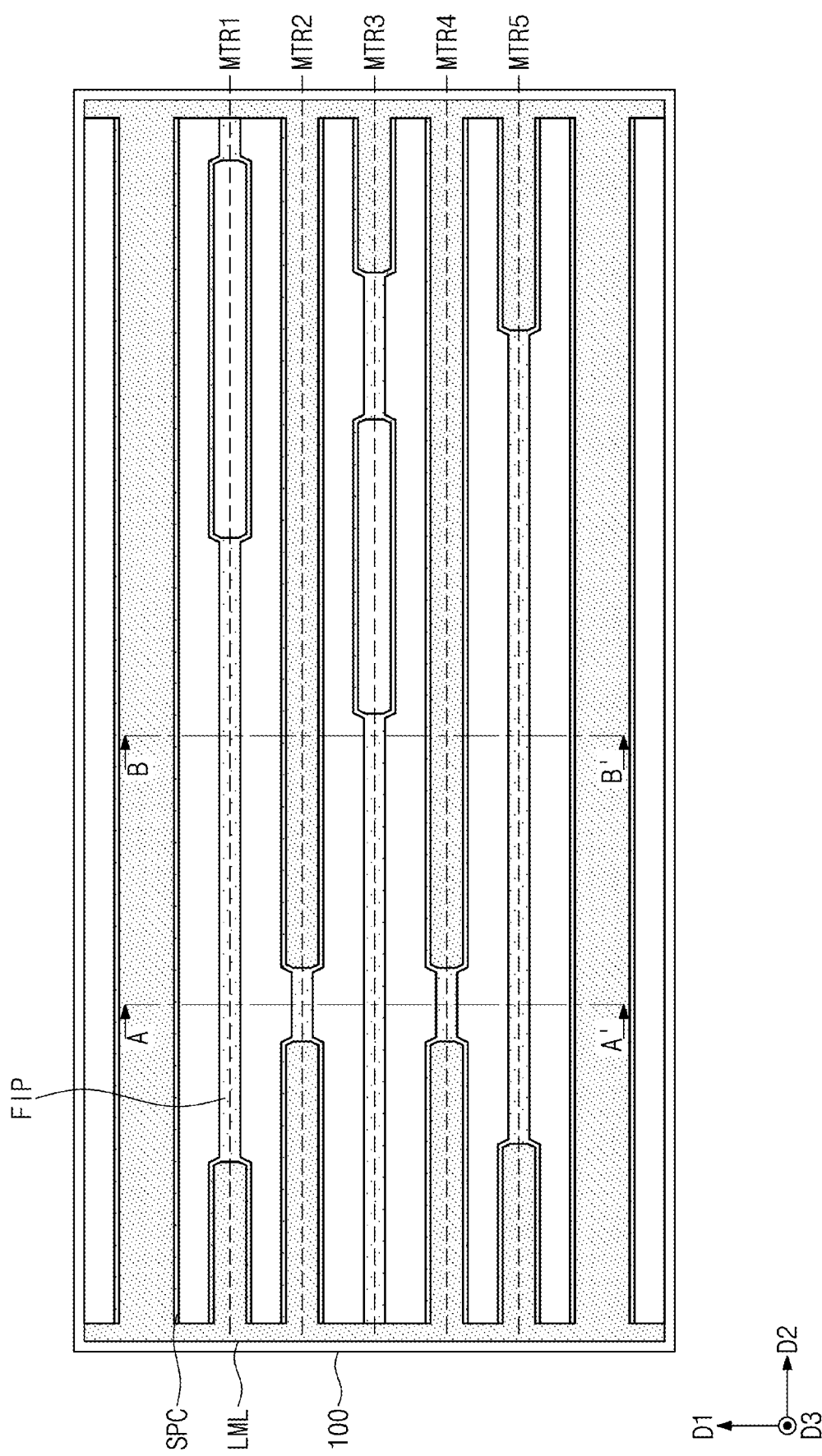
Figure 13A:
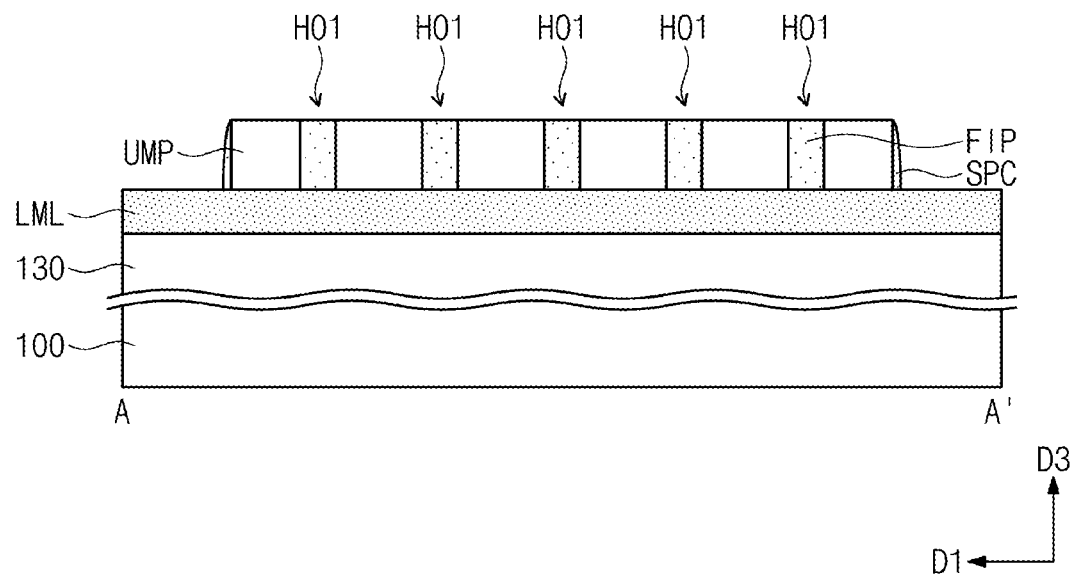
Figure 13B:
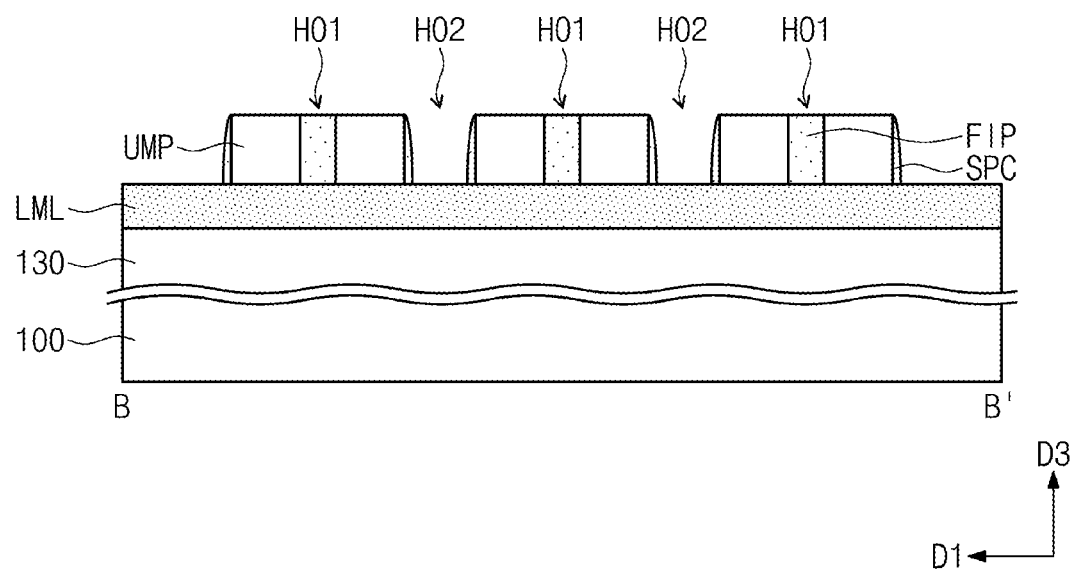

Referring to FIGS. 12, 13A, and 13B, the spacer layer SL may undergo an etch-back process to form a spacer SPC and a filling pattern FIP. The etch-back process may expose a portion of the lower mask layer LML. The spacer SPC may be formed in the second space HO2. For example, the spacer SPC may cover sidewalls of the line parts LIN of the upper mask patterns UMP (see FIG. 9). The filling pattern FIP may be formed to completely fill the first space HO1. For example, the filling pattern FIP may fill a space between the protruding parts PT of neighboring upper mask patterns UMP (see FIG. 9).

Figure 14:
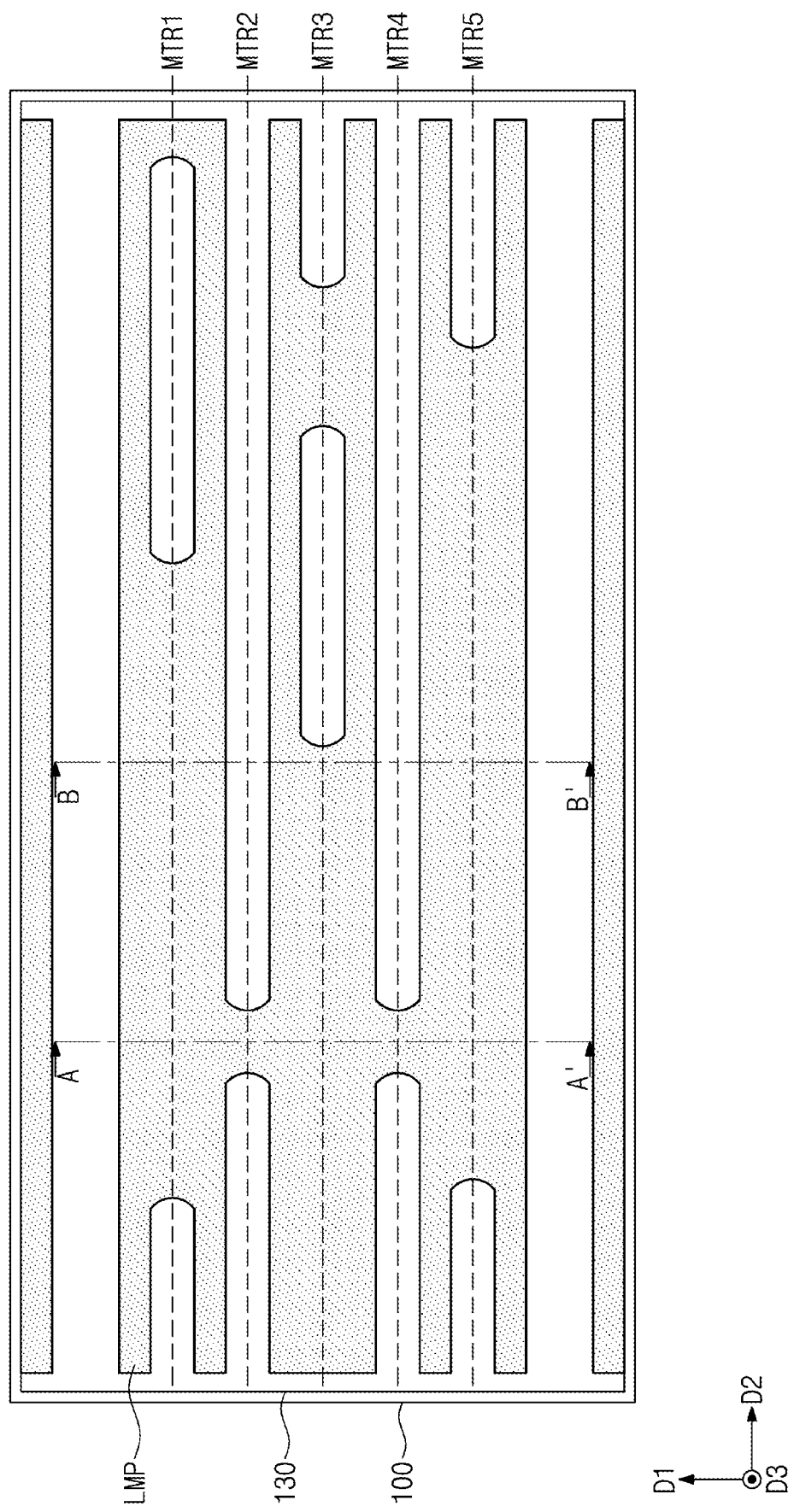
Figure 15A:
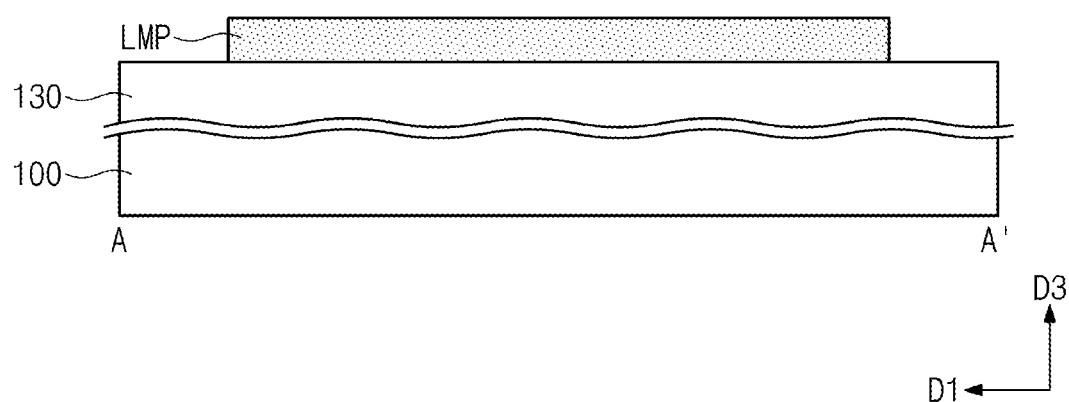
Figure 15B:
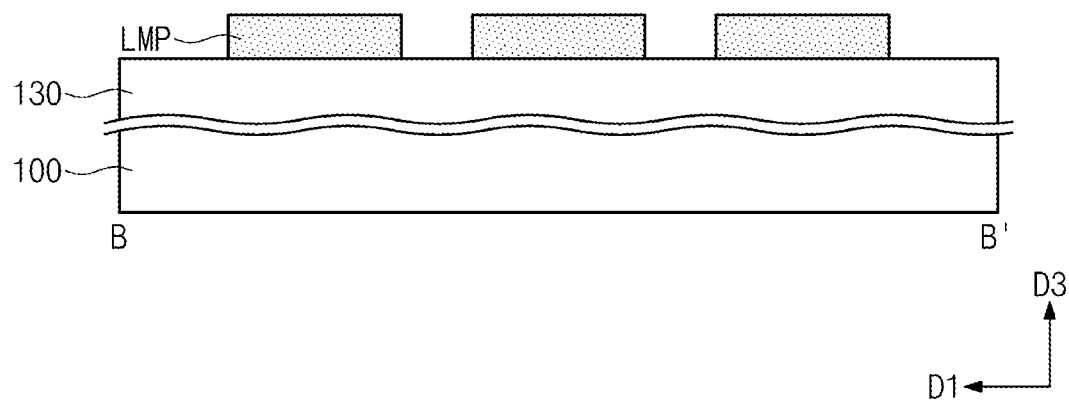

Referring to FIGS. 14, 15A, and 15B, an etching process may be performed in which the upper mask patterns UMP, the spacer SPC, and the filling pattern FIP are used as an etching mask to etch the lower mask layer LML to form lower mask patterns LMP. The etching process may expose a portion of the third interlayer dielectric layer 130.

Figure 16:
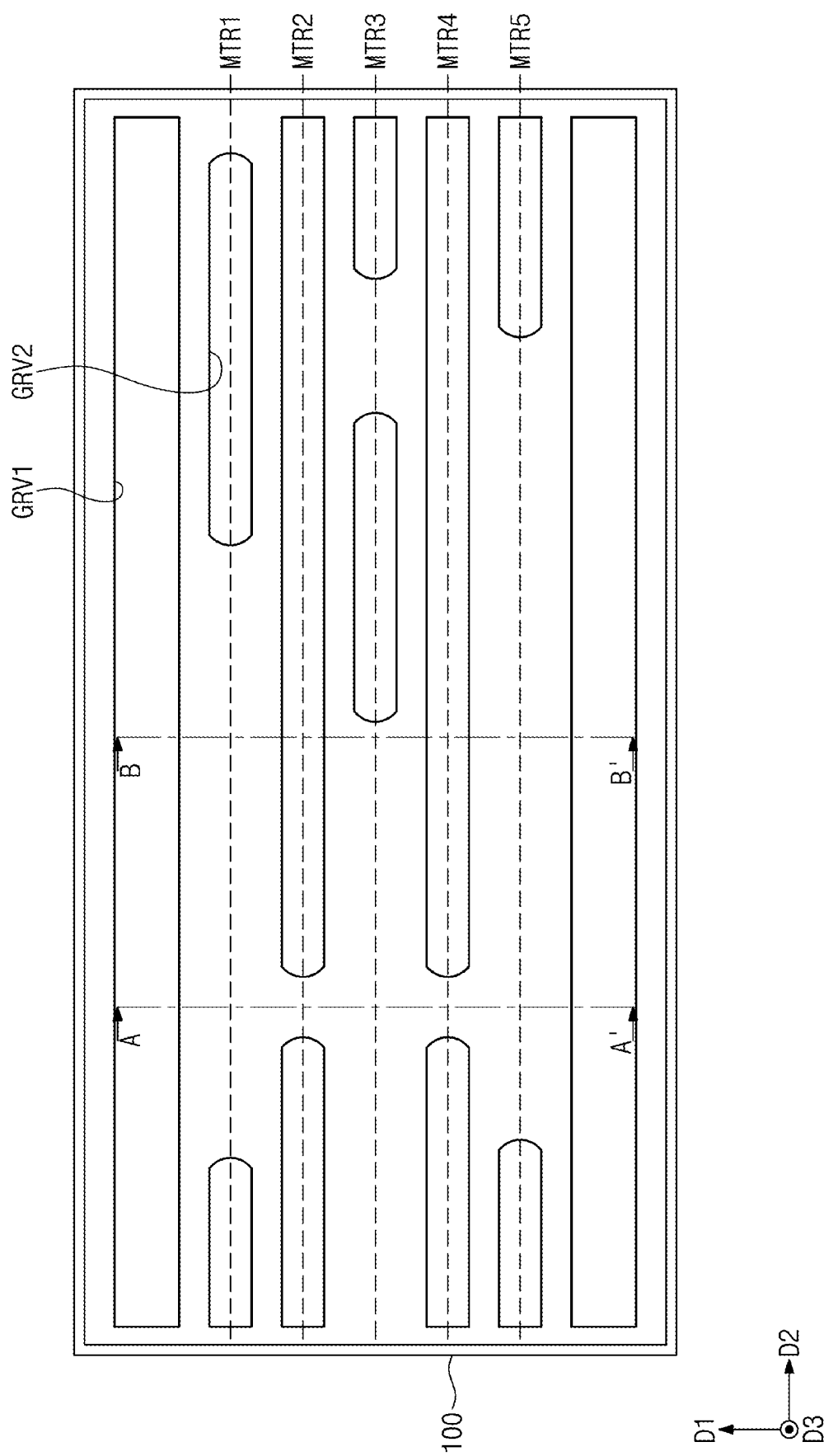
Figure 17A:
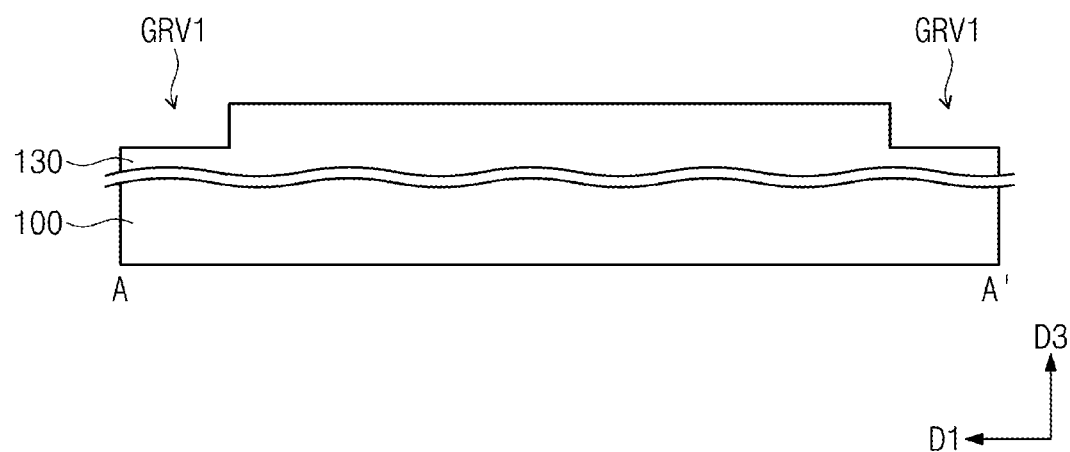
Figure 17B:
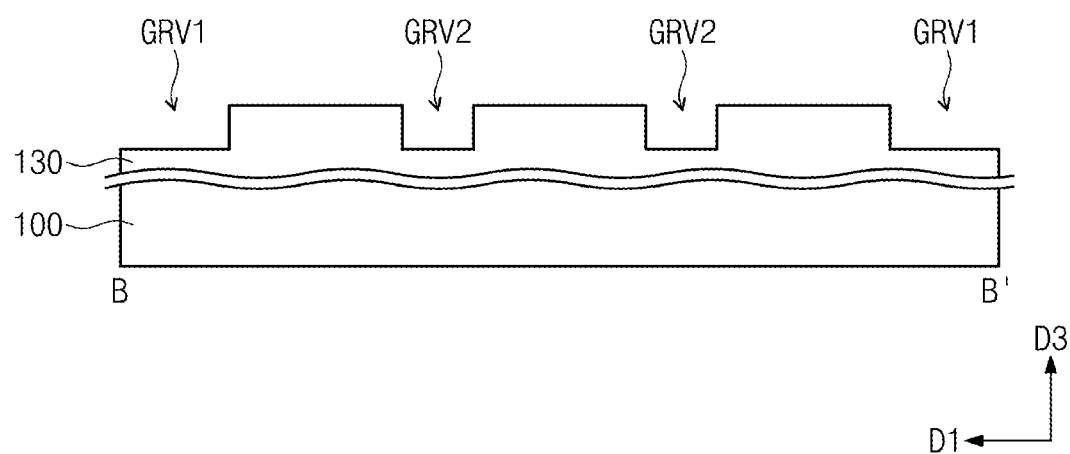
Figure 18A:
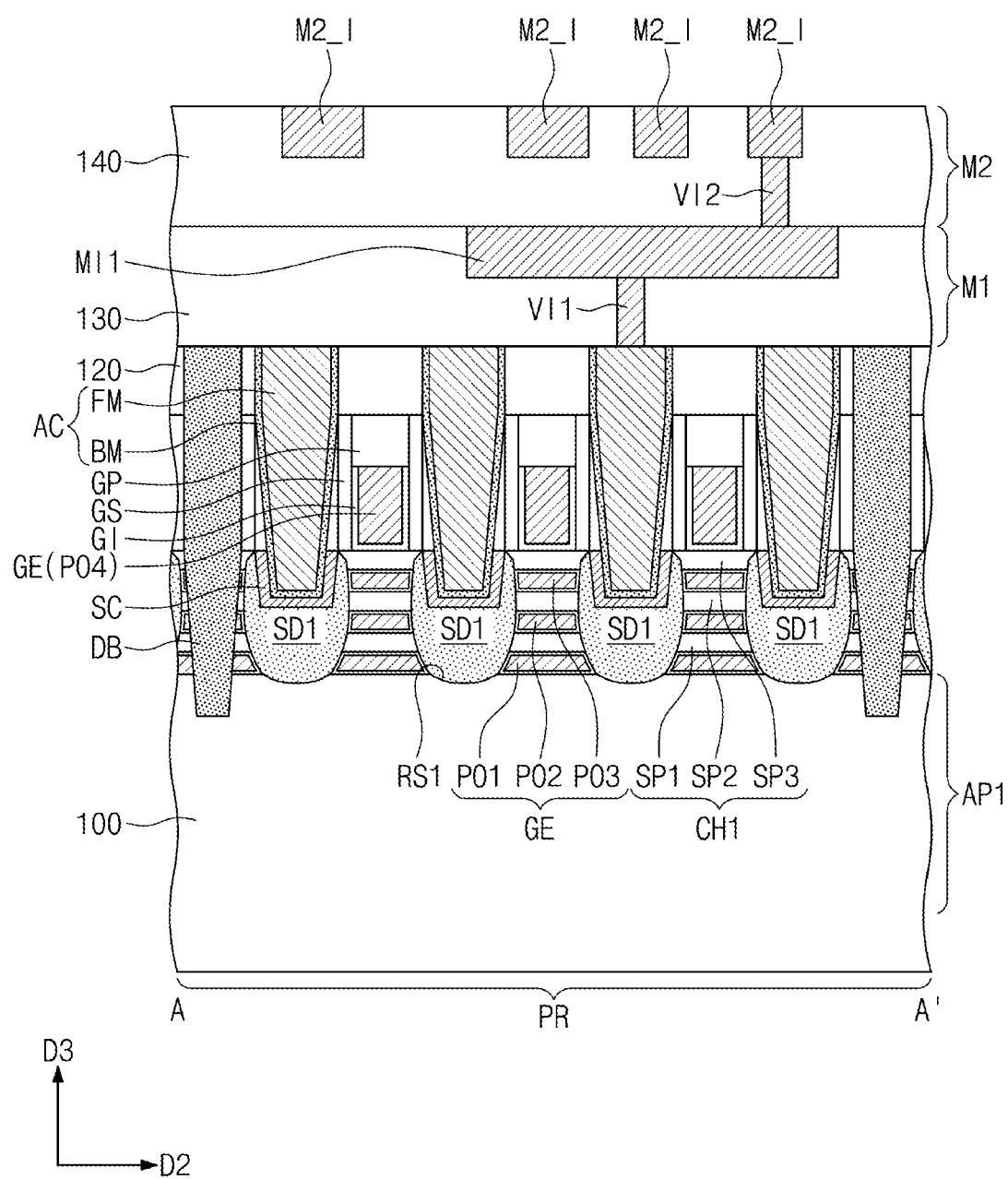
FIGS. 18A, 18B, 18C, and 18D illustrate cross-sectional views respectively taken along lines A-A', B-B', C-C', and D-D' of FIG. 1, showing a semiconductor device according to embodiments.
Figure 18B:
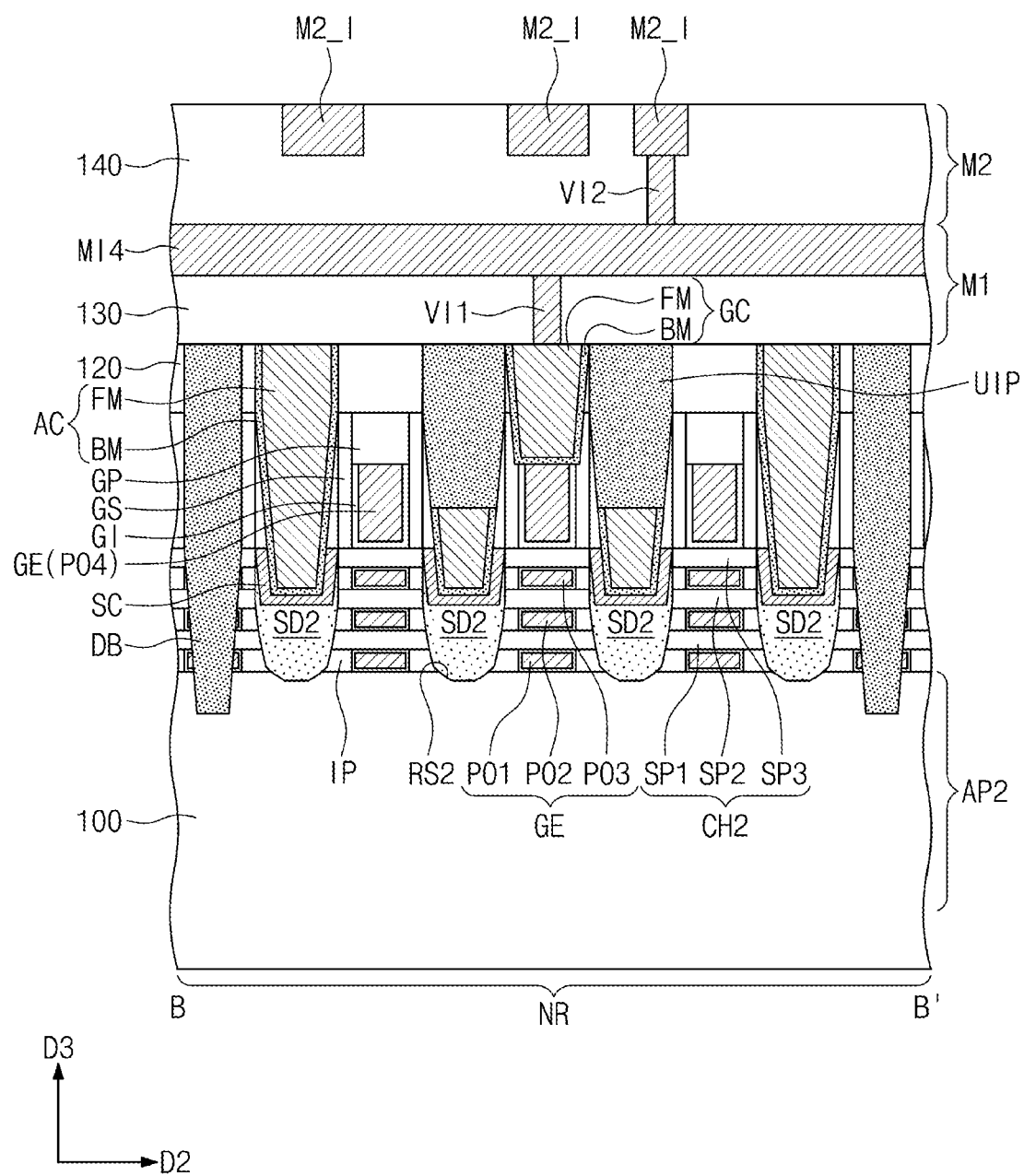
Figure 18C:
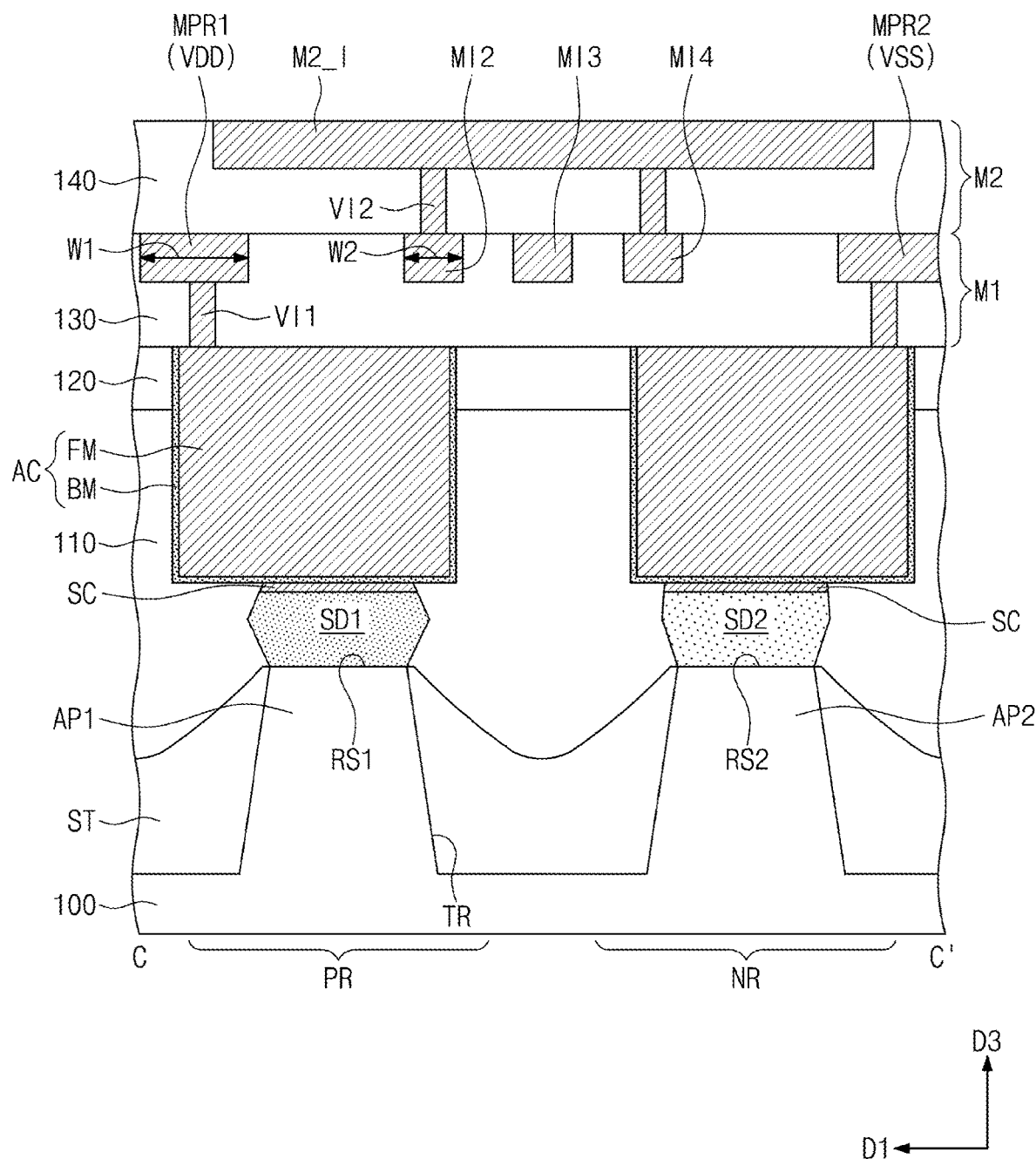
Figure 18D:
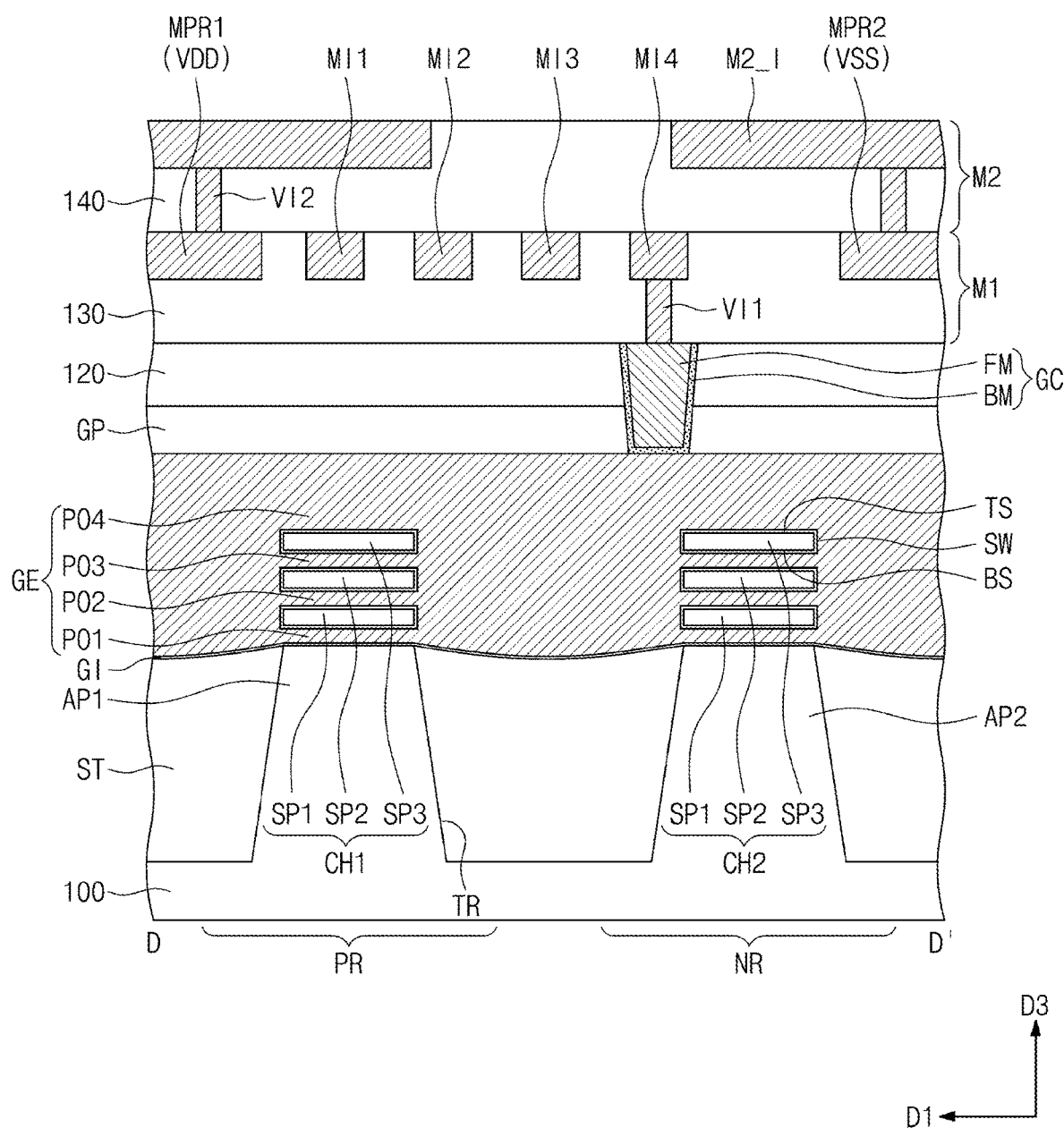

Referring to FIGS. 16, 17A, and 17B, the lower mask patterns LMP may be used as an etching mask to etch the third interlayer dielectric layer 130. First and second grooves GRV1 and GRV2 may be formed on an upper portion of the third interlayer dielectric layer 130. The second grooves GRV2 may be formed on the first to fifth wiring tracks MTR1 to MTR5. The first grooves GRV1 may be horizontally offset from the first to fifth wiring tracks MTR1 to MTR5. Each of the first grooves GRV1 may have a width greater than that of each of the second grooves GRV2.

Subsequently, the first and second grooves GRV1 and GRV2 may be filled with metal. Therefore, wiring lines of a first metal layer M1 may be formed on an upper portion of the third interlayer dielectric layer 130. First and second power lines MPR1 and MPR2 may be filled in the first grooves GRV1. First to fifth lower lines MI1 to MI5 may be formed in the second grooves GRV2.

FIGS. 18A, 18B, 18C, and 18D illustrate cross-sectional views respectively taken along lines A-A', B-B', C-C', and D-D' of FIG. 1, showing a semiconductor device according to some embodiments. In the embodiment that follows, a detailed description of technical features repetitive to those discussed above with reference to FIGS. 1, 2A to 2D, and 3 will be omitted, and a difference relative thereto will be discussed in detail.

Referring to FIGS. 18A to 18D, the first active pattern AP1 and the second active pattern AP2 may be defined by a trench TR formed on an upper portion of the substrate 100. The first active pattern AP1 and the second active pattern AP2 may be respectively provided on the PMOSFET region PR and the NMOSFET region NR. The first and second active patterns AP1 and AP2 may extend in the second direction D2. The first and second active patterns AP1 and AP2 may be vertically protruding portions of the substrate 100.

The trench TR may be filled with the device isolation layer ST. The device isolation layer ST may include a silicon oxide layer. The device isolation layer ST may not cover any of the first and second channel patterns CH1 and CH2.

The first channel pattern CH1 may be provided on the first active pattern AP1.

The second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3 that are sequentially stacked. The first, second, and third semiconductor patterns SP1, SP2, and SP3 may be spaced apart from each other in the vertical direction (or the third direction D3).

Each of the first, second, and third semiconductor patterns SP1, SP2, and SP3 may include, e.g., silicon (Si), germanium (Ge), or silicon-germanium (SiGe). For example, each of the first, second, and third semiconductor patterns SP1, SP2, and SP3 may include crystalline silicon.

A plurality of first source/drain patterns SD1 may be provided on the first active pattern AP1. The first source/drain patterns SD1 may be impurity regions having a first conductivity type (e.g., p-type). The first channel pattern CH1 may be interposed between a pair of first source/drain patterns SD1. For example, the pair of first source/drain patterns SD1 may be connected to each other through the stacked first, second, and third semiconductor patterns SP1, SP2, and SP3.

A plurality of second source/drain patterns SD2 may be provided on the second active pattern AP2. The second source/drain patterns SD2 may be impurity regions having a second conductivity type (e.g., n-type). The second channel pattern CH2 may be interposed between a pair of second source/drain patterns SD2. For example, the pair of second source/drain patterns SD2 may be connected to each other through the stacked first, second, and third semiconductor patterns SP1, SP2, and SP3.

The first and second source/drain patterns SD1 and SD2 may be epitaxial patterns formed by a selective epitaxial growth process. For example, each of the first and second source/drain patterns SD1 and SD2 may have a top surface at a level substantially the same as that of a top surface of the third semiconductor pattern SP3. For another example, each of the first and second source/drain patterns SD1 and SD2 may have a top surface at a level higher than that of a top surface of the third semiconductor pattern SP3.

Gate electrodes GE may be provided to extend in the first direction D1, while running across the first and second channel patterns CH1 and CH2. The gate electrode GE may vertically overlap the first and second channel patterns CH1 and CH2. A pair of gate spacers GS may be located on opposite sidewalls of the gate electrode GE. A gate capping pattern GP may be provided on the gate electrode GE.

The gate electrode GE may include a first part PO1 interposed between the first semiconductor pattern SP1 and the active pattern AP1 or AP2, a second part PO2 interposed between the first semiconductor pattern SP1 and the second semiconductor pattern SP2, a third part PO3 interposed between the second semiconductor pattern SP2 and the third semiconductor pattern SP3, and a fourth part PO4 on the third semiconductor pattern SP3.

Referring back to FIG. 18D, the gate electrode GE may be provided on a top surface TS, a bottom surface BS, and opposite sidewalls SW of each of the first, second, and third semiconductor patterns SP1, SP2, and SP3. In this sense, a transistor according to some embodiments may be a three-dimensional field effect transistor (e.g., MBCFET) in which the gate electrode GE three-dimensionally surrounds the first and second channel patterns CH1 and CH2.

A gate dielectric layer GI may be provided between the gate electrode GE and each of the first and second channel patterns CH1 and CH2. The gate dielectric layer GI may surround each of the first and second channel patterns CH1 and CH2.

On the NMOSFET region NR, a dielectric pattern IP may be interposed between the gate dielectric layer GI and the second source/drain pattern SD2. The gate dielectric layer GI and the dielectric pattern IP may separate the gate electrode GE from the second source/drain pattern SD2. In contrast, the dielectric pattern IP may be omitted from the PMOSFET region PR.

The first interlayer dielectric layer 110 and the second interlayer dielectric layer 120 may be provided on an entire surface of the substrate 100. Active contacts AC may be provided to penetrate the first and second interlayer dielectric layers 110 and 120 and to correspondingly have connection with the first and second source/drain patterns SD1 and SD2. Gate contacts GC may be provided to penetrate the second interlayer dielectric layer 120 and the gate capping pattern GP, and to have connection with corresponding gate electrodes GE. A description of the active contacts AC and the gate contacts GC may be substantially the same as that discussed above with reference to FIGS. 1 and 2A to 2D.

The third interlayer dielectric layer 130 may be provided on the second interlayer dielectric layer 120. The fourth interlayer dielectric layer 140 may be provided on the third interlayer dielectric layer 130. The first metal layer M1 may be provided in the third interlayer dielectric layer 130. The second metal layer M2 may be provided in the fourth interlayer dielectric layer 140. A description of the first metal layer M1 and the second metal layer M2 may be substantially the same as that discussed above with reference to FIGS. 1, 2A to 2D, and 3.

By way of summation and review, embodiments provide a method of fabricating a semiconductor device with improved electrical characteristics. That is, in a semiconductor device fabrication method according to embodiments, a conformally formed spacer layer may completely fill a first space that is a narrow gap between neighboring upper mask patterns. Therefore, finally formed wiring lines may be spaced apart from each other (tip to tip). In the case of a prior cutting process, a process variance may cause finally formed wiring lines to be connected without being spaced apart from each other, and/or may cause disconnection between neighboring wiring lines. However, according to embodiments, as the spacer layer is formed by using atomic layer deposition, it may be possible to reduce the process variance. As a result, a semiconductor device may increase in electrical characteristics. Moreover, the spacer layer may be formed by using atomic layer deposition that is a relatively simple process, and this may result in a simplified process, e.g., without cutting, as compared to the prior cutting process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:

sequentially forming an interlayer dielectric layer and a lower mask layer on a substrate;
forming on the lower mask layer a first upper mask pattern and a second upper mask pattern that are spaced apart from each other in a first direction, each of the first and second upper mask patterns having:
a line part that extends in a second direction intersecting the first direction, and
a first protruding part that protrudes from the line part, the first protruding part of the first upper mask pattern and the first protruding part of the second upper mask pattern being adjacent to each other;
forming a spacer and a filling pattern, such that the spacer covers sidewalls of the line part of each of the first and second upper mask patterns, and the filling pattern fills a space between the first protruding part of the first upper mask pattern and the first protruding part of the second upper mask pattern;
using the first upper mask pattern, the second upper mask pattern, the spacer, and the filling pattern as an etching mask to etch the lower mask layer to form lower mask patterns;
using the lower mask patterns as an etching mask to etch the interlayer dielectric layer to form grooves on the interlayer dielectric layer; and
forming wiring lines in the grooves.

2. The method as claimed in claim 1, wherein forming the spacer and the filling pattern includes:
forming a spacer layer that covers the lower mask layer, the first upper mask pattern, and the second upper mask pattern; and
performing an etch-back process on the spacer layer to form the spacer and the filling pattern.

3. The method as claimed in claim 2, wherein the spacer layer is formed of silicon oxide.

4. The method as claimed in claim 2, wherein the spacer layer is formed by an atomic layer deposition process.

5. The method as claimed in claim 2, wherein:
a first space is formed between the first protruding part of the first upper mask pattern and the first protruding part of the second upper mask pattern,
a second space is formed between the line part of the first upper mask pattern and the line part of the second upper mask pattern,
the first space maintains a constant width and extends in the second direction, and
the spacer layer completely fills the first space and partially fills the second space.

6. The method as claimed in claim 5, wherein forming the wiring lines includes forming a first line and a second line that are spaced apart from each other in the second direction, such that a distance in the second direction between the first line and the second line corresponds to a length of the first space.

7. The method as claimed in claim 6, wherein:
the first line includes a first end that faces the second line, and
the second line includes a second end that faces the first line, each of the first and second ends having a curved profile.

8. The method as claimed in claim 1, further comprising forming on the lower mask layer a third upper mask pattern that is spaced apart in the first direction from the second upper mask pattern,
wherein the third upper mask pattern has a line part that extends in the second direction and each of the second upper mask pattern and the third upper mask pattern has a second protruding part that protrudes from the line part of each of the second and third upper mask patterns, the second protruding part of the second upper mask pattern and the second protruding part of the third upper mask pattern being adjacent to each other.

9. The method as claimed in claim 8, wherein the filling pattern fills a space between the second protruding part of the second upper mask pattern and the second protruding part of the third upper mask pattern.

10. The method as claimed in claim 1, further comprising:
forming an upper mask layer on the lower mask layer;
forming photoresist patterns on the upper mask layer; and
using the photoresist patterns as an etching mask to etch the upper mask layer to form the first upper mask pattern and the second upper mask pattern.

11. A method of fabricating a semiconductor device, the method comprising:
sequentially forming an interlayer dielectric layer and a lower mask layer on a substrate;
forming on the lower mask layer a first upper mask pattern and a second upper mask pattern that are spaced apart from each other in a first direction, each of the first upper mask pattern and the second upper mask pattern having:
a line part that extends in a second direction intersecting the first direction, and
a protruding part that protrudes from the line part, the protruding part of the first upper mask pattern and the protruding part of the second upper mask pattern being adjacent to each other;
forming a spacer layer that covers the lower mask layer, the first upper mask pattern, and the second upper mask pattern;
performing an etch-back process on the spacer layer to form a spacer and a filling pattern;
using the first upper mask pattern, the second upper mask pattern, the spacer, and the filling pattern as an etching mask to etch the lower mask layer to form lower mask patterns;
using the lower mask patterns as an etching mask to etch the interlayer dielectric layer to form grooves on the interlayer dielectric layer; and
forming wiring lines in the grooves,
wherein a first space is formed between the protruding part of the first upper mask pattern and the protruding part of the second upper mask pattern,
wherein a second space is formed between the line part of the first upper mask pattern and the line part of the second upper mask pattern,
wherein the first space maintains a constant width and extends in the second direction, and
wherein the spacer layer completely fills the first space and partially fills the second space.

12. The method as claimed in claim 11, wherein:
the spacer covers sidewalls of the line part of each of the first upper mask pattern and the second upper mask pattern, and
the filling pattern fills the first space.

13. The method as claimed in claim 11, wherein the spacer layer is formed by an atomic layer deposition process.

14. The method as claimed in claim 11, wherein the spacer layer is formed of silicon oxide.

15. The method as claimed in claim 11, wherein forming the wiring lines includes forming a first line and a second line that are spaced apart from each other in the second direction, such that a distance in the second direction between the first line and the second line corresponds to a length of the first space.

16. A method of fabricating a semiconductor device, the method comprising:
sequentially forming an interlayer dielectric layer and a lower mask layer on a substrate;
forming an upper mask layer on the lower mask layer;
forming photoresist patterns on the upper mask layer;
using the photoresist patterns as an etching mask to etch the upper mask layer to form a first upper mask pattern and a second upper mask pattern that are spaced apart from each other in a first direction, and each of the first upper mask pattern and the second upper mask pattern having:
a line part that extends in a second direction intersecting the first direction, and
a first protruding part that protrudes from the line part, the first protruding part of the first upper mask pattern and the first protruding part of the second upper mask pattern being adjacent to each other;
forming a spacer layer that covers the lower mask layer, the first upper mask pattern, and the second upper mask pattern;
performing an etch-back process on the spacer layer to form a spacer and a filling pattern, such that the spacer covers sidewalls of the line part of each of the first upper mask pattern and the second upper mask pattern, and the filling pattern fills a space between the first protruding part of the first upper mask pattern and the first protruding part of the second upper mask pattern;
using the first upper mask pattern, the second upper mask pattern, the spacer, and the filling pattern as an etching mask to etch the lower mask layer to form lower mask patterns;
using the lower mask patterns as an etching mask to etch the interlayer dielectric layer to form grooves on the interlayer dielectric layer; and
forming wiring lines in the grooves.

17. The method as claimed in claim 16, wherein the spacer layer is formed by an atomic layer deposition process.

18. The method as claimed in claim 16, wherein:
a first space is formed between the first protruding part of the first upper mask pattern and the first protruding part of the second upper mask pattern,
a second space is formed between the line part of the first upper mask pattern and the line part of the second upper mask pattern,
the first space maintains a constant width and extends in the second direction, and
the spacer layer completely fills the first space and partially fills the second space.

19. The method as claimed in claim 16, further comprising forming on the lower mask layer a third upper mask pattern that is spaced apart in the first direction from the second upper mask pattern, such that the third upper mask pattern has a line part that extends in the second direction, and each of the second and third upper mask patterns has a second protruding part that protrudes from the line part of each of the second upper mask pattern and the third upper mask pattern, the second protruding part of the second upper mask pattern and the second protruding part of the third upper mask pattern being adjacent to each other.

20. The method as claimed in claim 19, wherein the filling pattern fills a space between the second protruding part of the second upper mask pattern and the second protruding part of the third upper mask pattern.

* * * * *